US012593452B2

(12) United States Patent
Kim et al.

(10) Patent No.: US 12,593,452 B2
(45) Date of Patent: Mar. 31, 2026

(54) MEMORY DEVICE HAVING VERTICAL STRUCTURE AND MEMORY SYSTEM INCLUDING THE MEMORY DEVICE

(71) Applicant: SAMSUNG ELECTRONICS CO., LTD., Suwon-si (KR)

(72) Inventors: Changbum Kim, Seoul (KR); Sunghoon Kim, Seongnam-si (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 687 days.

(21) Appl. No.: 18/045,971

(22) Filed: Oct. 12, 2022

(65) Prior Publication Data

US 2023/0165008 A1     May 25, 2023

(30) Foreign Application Priority Data

Nov. 22, 2021     (KR) ........................ 10-2021-0161493

(51) Int. Cl.
*H10B 43/40*     (2023.01)
*G11C 16/08*     (2006.01)
(Continued)

(52) U.S. Cl.
CPC ............. *H10B 43/40* (2023.02); *G11C 16/08* (2013.01); *G11C 16/24* (2013.01); *H01L 23/535* (2013.01);
(Continued)

(58) Field of Classification Search
CPC ..... G11C 16/08; G11C 16/24; G11C 16/0483; G11C 5/025; G11C 5/02; G11C 4/06;
(Continued)

(56) References Cited

U.S. PATENT DOCUMENTS 8,040,726 B2    10/2011 Kwak
8,797,777 B2 *   8/2014 Hishida .................. G11C 5/063
                                                         365/185.05
(Continued)

FOREIGN PATENT DOCUMENTS

KR    10-2016-0000956 A    1/2016
KR    10-2019-0007147      1/2019
KR    10-2021-0060853 A    5/2021

OTHER PUBLICATIONS

EESR dated Jun. 21, 2023 in corresponding EP Patent Application No. 22206179.8.
(Continued)

*Primary Examiner* — Galina G Yushina
(74) *Attorney, Agent, or Firm* — Morgan, Lewis & Bockius LLP

(57) ABSTRACT

A memory device includes a first lower semiconductor layer and a second lower semiconductor layer. The first lower semiconductor layer is disposed below a first upper semiconductor layer including a first memory cell array. The first lower semiconductor layer includes a first page buffer electrically connected to the first memory cell array. The second lower semiconductor layer is disposed below a second upper semiconductor layer includes a second memory cell array and disposed adjacent to the first upper semiconductor layer in a first direction. The second lower semiconductor layer includes a first portion of a second page buffer electrically connected to the second memory cell array and being disposed adjacent to the first lower semiconductor layer in the first direction. The first lower semiconductor layer further includes a second portion of the second page buffer different from the first portion.

11 Claims, 18 Drawing Sheets

(51) Int. Cl.

| | | |
|---|---|---|
| *G11C 16/24* | (2006.01) | |
| *H01L 23/535* | (2006.01) | |
| *H10B 41/27* | (2023.01) | |
| *H10B 41/41* | (2023.01) | |
| *H10B 43/27* | (2023.01) | |

(52) U.S. Cl.
CPC ............. *H10B 41/27* (2023.02); *H10B 41/41* (2023.02); *H10B 43/27* (2023.02)

(58) Field of Classification Search
CPC ......... G11C 5/04; G11C 16/10; H01L 23/535; H10B 41/27; H10B 41/41; H10B 43/27; H10B 43/50; H10B 43/35
See application file for complete search history.

(56) References Cited

U.S. PATENT DOCUMENTS

| | | | |
|---|---|---|---|
| 9,047,953 B2 | 6/2015 | Chen | |
| 9,799,672 B2 | 10/2017 | Son et al. | |
| 9,941,009 B2 | 4/2018 | Lim et al. | |
| 10,007,603 B2 | 6/2018 | Lee et al. | |
| 10,664,395 B2 | 5/2020 | Oh et al. | |
| 11,200,002 B2 | 12/2021 | Choi et al. | |
| 2007/0064485 A1* | 3/2007 | Han | G11C 16/10 |
| | | | 365/185.12 |
| 2017/0123724 A1* | 5/2017 | Park | G11C 16/0483 |
| 2017/0330624 A1* | 11/2017 | Lim | H10B 43/30 |
| 2019/0115357 A1* | 4/2019 | Oh | H10D 62/115 |
| 2019/0164991 A1 | 5/2019 | Lim et al. | |
| 2020/0227398 A1 | 7/2020 | Oh et al. | |
| 2021/0090655 A1* | 3/2021 | Abiko | G11C 16/32 |
| 2021/0118862 A1* | 4/2021 | Maejima | H01L 25/18 |
| 2021/0193680 A1 | 6/2021 | Lim et al. | |

OTHER PUBLICATIONS

Office Action of Korean Patent Office in Application No. 10-2021-0161493, dated Jul. 30, 2025. (Note: US 2017/0330624 A was previously cited.).

* cited by examiner

MEMORY DEVICE HAVING VERTICAL STRUCTURE AND MEMORY SYSTEM INCLUDING THE MEMORY DEVICE

CROSS-REFERENCE TO RELATED APPLICATION

This U.S. non-provisional patent application claims priority under 35 U.S.C. § 119 to Korean Patent Application No. 10-2021-0161493, filed on Nov. 22, 2021, in the Korean Intellectual Property Office, the disclosure of which is incorporated by reference in its entirety herein.

TECHNICAL FIELD

The inventive concept relates to a memory device, and more particularly, to a memory device having a vertical structure and a memory system including the memory device.

DISCUSSION OF RELATED ART

Memory devices are used to store data and are classified as volatile memory devices and non-volatile memory devices. For example, a flash memory device, which is an example of a non-volatile memory device, may be used in mobile phones, digital cameras, portable digital assistants (PDAs), portable computer devices, stationary computer devices, and other devices.

Memory cells maybe stacked three-dimensionally and the size of the memory cells may be reduced to improve the degree of integration of a non-volatile memory device. Accordingly, operation circuits and wiring structures included in the non-volatile memory devices for operations and electrical connections have become complicated.

SUMMARY

At least one embodiment of the inventive concept provides a memory device in which a first lower semiconductor layer is configured to include at least a portion of a page buffer so that a width of an internal peripheral circuit region formed in a second lower semiconductor layer is large.

According to an embodiment of the inventive concept, there is provided a memory device including a first lower semiconductor layer disposed below a first upper semiconductor layer including a first memory cell array, the first lower semiconductor layer including a first page buffer electrically connected to the first memory cell array and a second lower semiconductor layer disposed below a second upper semiconductor layer including a second memory cell array and disposed adjacent to the first upper semiconductor layer in a first direction, the second lower semiconductor layer including a first portion of a second page buffer electrically connected to the second memory cell array and disposed adjacent to the first lower semiconductor layer in the first direction. The first lower semiconductor layer further includes a second other portion of the second page buffer.

According to an embodiment of the inventive concept, there is provided a memory device including a first lower semiconductor layer overlapping with a first upper semiconductor layer including a first memory cell array, and including a first page buffer electrically connected to the first memory cell array, a second lower semiconductor layer overlapping with a second upper semiconductor layer including a second memory cell array and adjacent to the first upper semiconductor layer in a first direction, and including a first portion of a second page buffer electrically connected to the second memory cell array, a third lower semiconductor layer overlapping with a third upper semiconductor layer including a third memory cell array and adjacent to the first upper semiconductor layer in a second direction perpendicular to the first direction, and including a third page buffer electrically connected to the third memory cell array, and a fourth lower semiconductor layer overlapping with a fourth upper semiconductor layer including a fourth memory cell array and adjacent to the third upper semiconductor layer in the first direction and adjacent to the second upper semiconductor layer in the second direction, and including a first portion of a fourth page buffer electrically connected to the fourth memory cell array. The first lower semiconductor layer includes a second portion of the second page buffer different from the first portion of the second page buffer. The third lower semiconductor layer includes a second portion of the fourth page buffer different from the first portion of the fourth page buffer.

According to an embodiment of the inventive concept, there is provided a non-volatile memory device including a first lower semiconductor layer disposed below a first upper semiconductor layer including a first memory cell array, the first lower semiconductor layer overlapping with the first upper semiconductor layer in a vertical direction and a second lower semiconductor layer disposed below a second upper semiconductor layer including a second memory cell array and disposed adjacent to the first upper semiconductor layer in a first direction, and the second lower semiconductor layer overlapping with the second upper semiconductor layer in a vertical direction. The first lower semiconductor layer includes a first page buffer disposed in a second direction perpendicular to the first direction and electrically connected to the first memory cell array, a plurality of cache latches disposed in the second direction and spaced apart from the first page buffer in the first direction, and disposed at an edge of the second page buffer electrically connected to the second memory cell array to overlap with the first upper semiconductor layer in a vertical direction, and a first row decoder disposed adjacent to the first page buffer and the plurality of cache latches in the second direction and electrically connected to the first memory cell array.

BRIEF DESCRIPTION OF THE DRAWINGS

Embodiments of the inventive concept will be more clearly understood from the following detailed description taken in conjunction with the accompanying drawings in which:

FIG. 1 is a block diagram illustrating a memory device of the related art;

FIG. 5 is a schematic diagram illustrating a cross-section of a memory device according to example embodiments of the inventive concept;

DETAILED DESCRIPTION OF THE EMBODIMENTS

Figure 2:
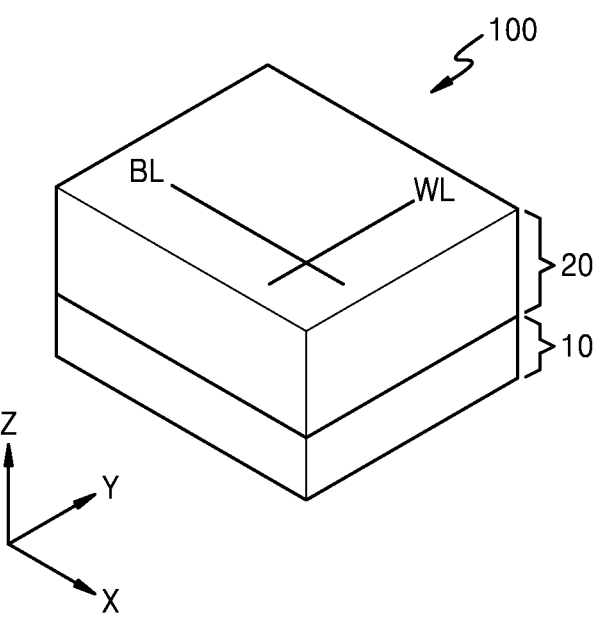
FIG. 2 is a schematic diagram illustrating a structure of the memory device of FIG. 1 according to an embodiment of the inventive concept.

Hereinafter, various embodiments of the inventive concept are described with reference to the accompanying drawings. Hereinafter, a direction indicated by the arrow in the drawing and the opposite direction thereof are described as the same direction. In the drawings of the disclosure, only a part may be shown for the convenience of illustration. In descriptions with reference to the drawings, the same or corresponding components are given the same reference numerals, and repeated descriptions thereof will be omitted.

Figure 1:
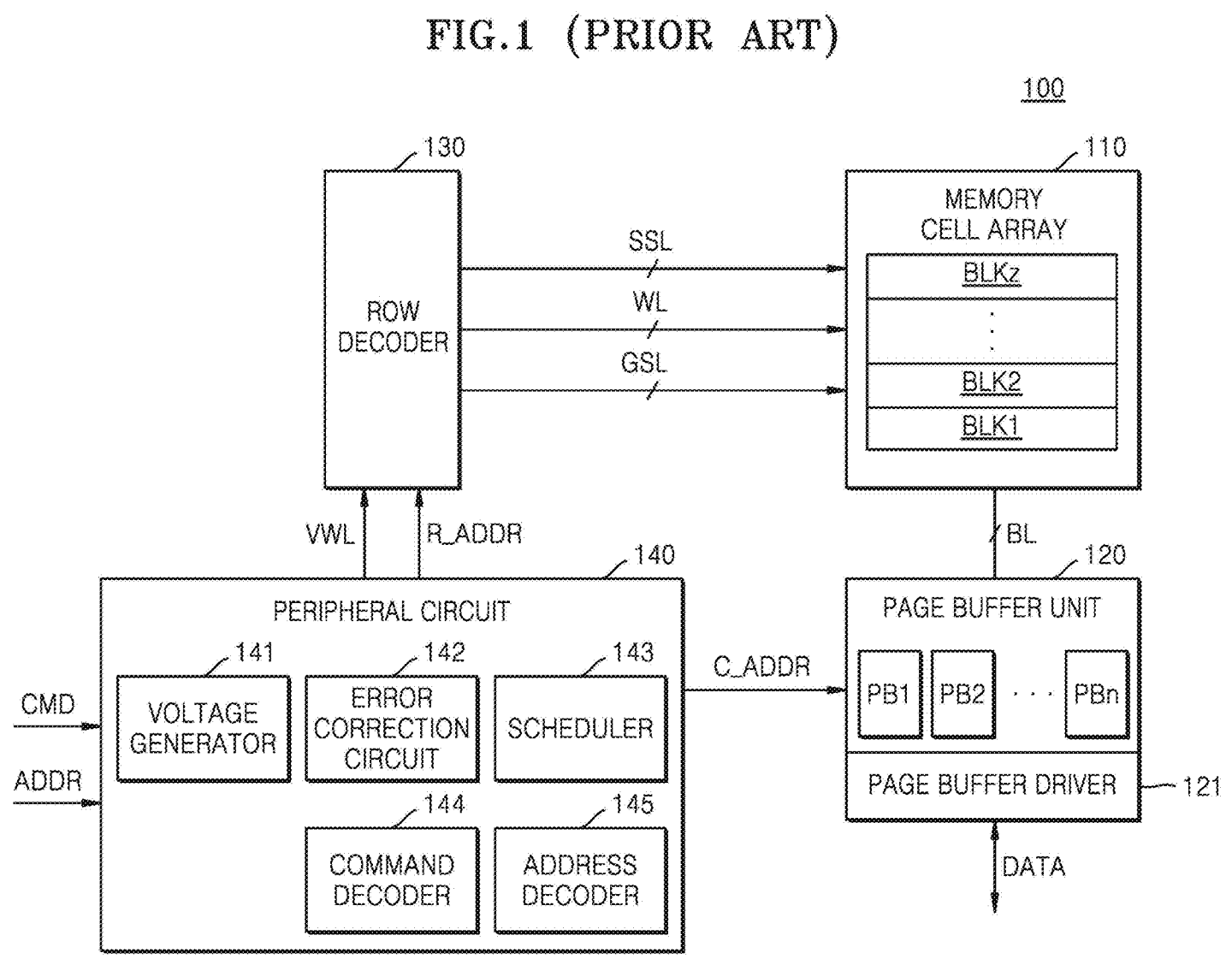

FIG. 1 is a block diagram illustrating a memory device of the related art according to an example embodiment of the inventive concept.

Referring to FIG. 1, the memory device 100 may include a memory cell array 110, a page buffer unit 120 (e.g., a buffer or buffer circuit), a page buffer driver 121 (e.g., a driver circuit), a row decoder 130 (e.g., a decoder circuit), and a peripheral circuit 140.

The memory cell array 110 may include a plurality of memory cells. For example, the plurality of memory cells may be flash memory cells. However, the inventive concept is not limited thereto, and the plurality of memory cells may include a resistive random access memory (RRAM) cell, a ferroelectric RAM (FRAM) cell, a phase change RAM (PRAM) cell, a thyristor RAM (TRAM) cell, and a magnetic RAM (MRAM) cell. Hereinafter, a case in which the plurality of memory cells are NAND flash memory cells is mainly described, and accordingly, the memory device 100, which is a non-volatile memory device, may be referred to as an 'NVM device'.

The memory cell array 110 may include a plurality of memory blocks BLK1 to BLKz, and each of the memory blocks BLK1 to BLKz may include a plurality of memory cells. The memory cell array 110 may be connected to the page buffer unit 120 through bit lines BL, and may be connected to the row decoder 130 through a plurality of word lines WL, a plurality of string select lines SSL, and a plurality of ground select lines GSL.

The memory cell array 110 may include a 3D memory cell array, and the 3D memory cell array may include a plurality of memory NAND strings. Each of the memory NAND strings may include memory cells respectively connected to word lines stacked vertically on a substrate. U.S. Pat. Nos. 7,679,133, 8,553,466, 8,654,587, 8,559,235, and U.S. Application Publication No. 2011/0233648 are incorporated herein by reference in their entirety and disclose detailed suitable configurations for a 3-dimensional memory array including multiple levels and in which word lines and/or bit lines are shared between the levels. However, the inventive concept is not limited thereto. The memory cell array 110 may include a three-dimensional (3D) memory cell array including a plurality of cell strings, which is described in detail with reference to FIG. 8 described below.

The page buffer unit 120 may include a plurality of page buffers PB1 to PBn (n is an integer of 2 or greater). Each of the page buffers PB1 to PBn may be connected to memory cells through a plurality of bit lines BL. Each of the page buffers PB1 to PBn may include a read circuit performing a read operation on data, a write circuit performing a write operation on data, and a plurality of latches temporarily storing data. A given one of the page buffers PB1 to PBn may be configured to store a page of data of the memory cell array 110. Each of the blocks (e.g., BLK1) of the memory cell array 110 may include several pages. The latches may include cache latches. The page buffer unit 120 may select at least some of the memory cells of the memory cell array 110 in a column direction. The page buffer unit 120 may select at least one bit line among the bit lines BL in response to a column address C_ADDR. The page buffer unit 120 may operate as a write driver or a sense amplifier according to an operation mode. In this disclosure, a "page buffer unit" may include a plurality of page buffers. Accordingly, references to a "first page buffer" or a "second page buffer" are to be understood as referring to constituent page buffers within a corresponding page buffer unit, unless otherwise specified.

For example, during a program operation, the page buffer unit 120 may apply a bit line voltage corresponding to data to be programmed to selected memory cells among the memory cells of the memory cell array 110. During the read operation, the page buffer unit 120 may detect a current or voltage of the selected memory cell among the memory cells of the memory cell array 110 to detect data stored in the selected memory cell.

Although not shown in FIG. 1, the page buffer unit 120 may further include a column decoder and receive a column address from the peripheral circuit 140. When the page buffer unit 120 includes the column decoder, the page buffers PB1 to PBn may be arranged for each output line of the column decoder, instead of being arranged for each bit line.

The page buffer driver 121 may include a circuit inputting data DATA received from outside (e.g., a memory controller) the memory device 100 into the page buffer unit 120 or outputting data DATA received from the page buffer unit 120 to the outside of the memory device 100. The page buffer driver 121 may control latches respectively included in the page buffers PB1 to PBn. For example, the page buffer driver 121 may be electrically connected to latches respectively included in the page buffers PB1 to PBn to transmit or receive data. For example, the page buffer driver 121 may be electrically connected to cache latches that are included in the page buffers PB1 to PBn. For example, the circuit may be an input/output (I/O) circuit including one or more multiplexers, demultiplexers, or switches, to enable data to be transmitted to the cache latches or data stored in the cache latches to be transmitted to outside the memory device 100.

The row decoder 130 may be connected to each of the memory cells of the memory cell array 110. The row decoder 130 may select at least some of the memory cells of the memory cell array 110 in a row direction. In response to a word line voltage VWL or a row address R_ADDR received from the peripheral circuit 140, the row decoder 130 may select one of the word lines WL, one of the string select lines SSL, and one of the ground select lines GSL. For example, the row decoder 130 may select at least one of the word lines WL based on the row address R_ADDR and apply the word line voltage VWL to the selected word line.

The memory cells selected by the word line selected by the row decoder 130 may be referred to as pages, and data may be written to the memory cell array 110 in units of pages or may be read from the memory cell array 110. For example, during the program operation, the row decoder 130 may apply a program voltage and a program verification voltage to selected memory cells among memory cells of the memory cell array 110, and during the read operation, the row decoder 130 may apply a read voltage to the selected memory cells among the memory cells of the memory cell array 110.

The row decoder 130 may be disposed adjacent to the memory cell array 110 and include the same circuits repeatedly disposed adjacent to each of the word lines arranged in the memory cell array 110, thereby improving delay of a signal applied to the word lines. Accordingly, the row decoder 130 may have substantially the same length as the memory cell array 110 in a direction in which the word lines are arranged (e.g., a direction perpendicular to a direction in which the word lines extend).

The peripheral circuit 140 may generally control various operation modes in the memory device 100. The peripheral circuit 140 may receive a command CMD and/or an address ADDR from the outside (e.g., a memory controller, etc.) of the memory device 100. The peripheral circuit 140 may output various internal control signals enabling the memory cell array 110 to perform a program, read, or erase operation based on the received command CMD and/or address ADDR. For example, the peripheral circuit 140 may store data in the memory cell array 110 or read and output stored data from the memory cell array 110 using various internal control signals. The peripheral circuit 140 may provide a column address C_ADDR to the page buffer unit 120, and may provide the row address R_ADDR and the word line voltage VWL to the row decoder 130.

The peripheral circuit 140 may include at least one of a voltage generator 141, an error correction circuit 142, a scheduler 143 (e.g., a logic circuit), a command decoder 144 (e.g., a decoder circuit), and an address decoder 145 (e.g., a decoder circuit).

The voltage generator 141 may generate various voltages necessary for the operation of the memory device 100 including the word line voltage VWL. For example, the voltage generator 141 may generate a program voltage, a read voltage, a program verification voltage, an erase voltage, etc. as the word line voltage VWL.

The error correction circuit 142 may correct an error in data read from the memory cell array 110.

The scheduler 143 may adjust voltage levels of control signals according to an operation mode of the memory device 100, and may control voltage application timing and/or application time. The scheduler 143 may control program, read, and/or erase operation conditions for the memory cell array 110.

The command decoder 144 may latch and decode the command CMD received from the outside of the memory device 100, and may set an operation mode of the memory device 100 according to the decoded command.

The address decoder 145 may latch and decode the address signal ADDR received from the outside of the memory device 100, and may activate a selected memory block according to the decoded address.

The memory cell array 110, the page buffer unit 120, the row decoder 130, and the peripheral circuit 140 of the memory device 100 according to the inventive concept may be formed on the same substrate. The memory device 100 may be implemented in a Cell-On-Peri or Cell-Over-Peri (COP) structure. For example, the memory device may be implemented to have a smaller size. At least some of the page buffer unit 120, the row decoder 130, and the peripheral circuit 140 may be formed below the memory cell array 110 and a region of the peripheral circuit 140 not overlapping in a direction perpendicular to the memory cell array 110 may be formed to be smaller. Hereinafter, a structure of the memory device 100 is described with reference to FIG. 1.

FIG. 2 is a schematic diagram illustrating a structure of the memory device 100 according to an example embodiment of the inventive concept. In detail, FIG. 2 shows an example structure of the memory device 100 of FIG. 1. As described above with reference to FIG. 1, the memory device 100 may include the memory cell array 110, the row decoder 130, the page buffer unit 120, and the peripheral circuit 140, and such components of the memory device may be formed through a semiconductor manufacturing process. Hereinafter, descriptions are given with reference to FIG. 1.

Referring to FIG. 2, the memory device 100 includes a lower semiconductor layer 10 and an upper semiconductor layer 20. The upper semiconductor layer 20 may be stacked on the lower semiconductor layer 10 in a third direction Z.

At least some of the page buffer unit (120 of FIG. 1), the row decoder (130 of FIG. 1), and the peripheral circuit (140 of FIG. 1) may be formed in the lower semiconductor layer 10. The lower semiconductor layer 10 may include a substrate. By forming semiconductor devices such as transistors and patterns for wiring devices on the substrate of the lower semiconductor layer 10, circuits corresponding to at least some of the page buffer unit 120, the row decoder 130, and the peripheral circuit 140 may be formed in the lower semiconductor layer 10.

The memory cell array (110 of FIG. 1) may be formed in the upper semiconductor layer 20. At the upper semiconductor layer 20, the bit lines BL may extend in a first direction X perpendicular to the third direction Z, and the word lines WL may extend in a second direction Y perpendicular to the third direction Z. As described above with reference to FIG. 1, each of the plurality of memory cells included in the memory cell array 110 may be accessed by the word lines WL and the bit lines BL, and the word lines WL and the bit lines BL may be electrically connected to circuits corresponding to the page buffer unit 120 and the row decoder 130 formed in the lower semiconductor layer 10.

The upper semiconductor layer 20 may be formed after the lower semiconductor layer 10 is formed. Patterns for electrically connecting the word lines WL and bit lines BL of the memory cell array 110 to circuits corresponding to the page buffer unit 120 may be formed in the upper semiconductor layer 20 and the row decoder 130 may be formed in the lower semiconductor layer 10. Accordingly, the memory device 100 may have a structure in which the memory cell array 110 and other circuits (i.e., circuits corresponding to the page buffer unit 120, the row decoder 130, and the peripheral circuit 140) are arranged in a stacking direction (i.e., the third direction Z. Such a structure may be referred to as a 'COP structure'. When the memory device 100 is implemented in the COP structure in which circuits other than the memory cell array 110 are disposed below the memory cell array 110, an area occupied in a direction (e.g., the first direction X and/or the second direction Y) perpendicular to the stacking direction may be effectively reduced, and the number of memory devices 100 manufactured from a single wafer may be increased.

Although not shown in FIG. 2, a plurality of pads may be disposed for electrical connection between the memory device 100 and an outside device (e.g., a memory controller). For example, a plurality of pads for receiving the command signal (CMD in FIG. 1) and the address signal (ADDR in FIG. 1) from the outside of the memory device 100 and a plurality of pads for inputting and outputting the data (DATA of FIG. 1) may be disposed in the memory device 100. The pads may be disposed adjacent to the peripheral circuit 140 that processes a signal received from the outside of the memory device 100 or a signal transmitted to the outside of the memory device 100.

As described above with reference to FIG. 1, each of the page buffer unit 120 and the row decoder 130 may have the same length as that of the memory cell array 110 in a certain direction. Due to the arrangement of the page buffer unit 120 and the row decoder 130, there may be restrictions to disposing the peripheral circuit 140 in the lower semiconductor layer 10. Thus, some circuits included in the peripheral circuit 140 may be formed in the lower semiconductor layer 10 so as not to overlap with the memory cell array 110 in the third direction Z. As a result, an area in a plane perpendicular to the third direction Z of the memory device 100 may increase, and improvement in the degree of integration of the memory device 100 may be limited.

However, as will be described below, in the case of the memory device 100 according to an example embodiment of the inventive concept, restrictions of the peripheral circuit 140 in terms of arrangement may be resolved, thereby practically realizing the COP structure in the memory device 100, and thus improving the integration of the memory device 100. Hereinafter, example embodiments of the inventive concept capable of resolving the restrictions in terms of the arrangement of the peripheral circuit 140 are described in detail.

Figure 3:
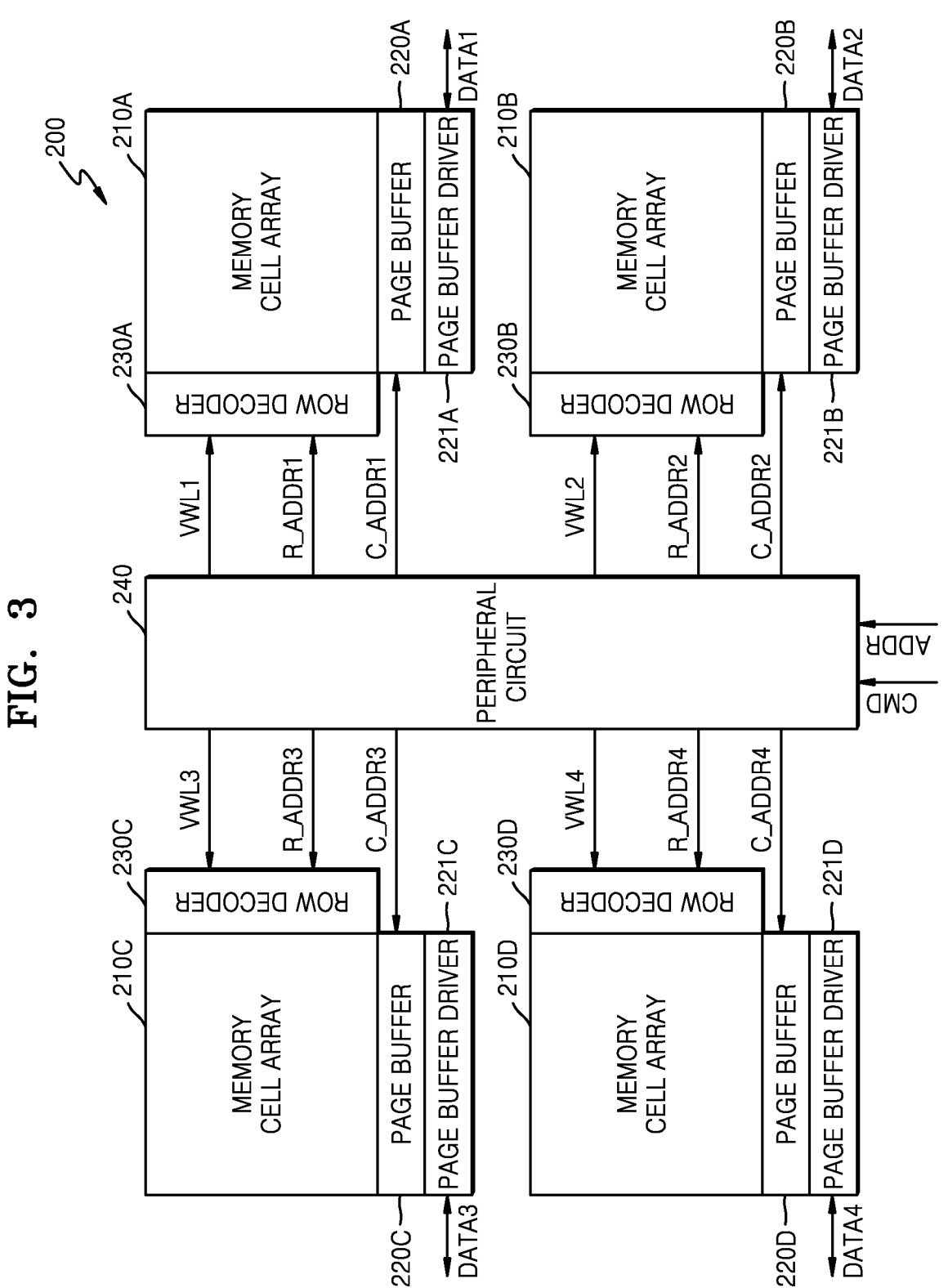
FIG. 3 is a block diagram of a memory device according to an embodiment of the inventive concept.

FIG. 3 is a block diagram of a memory device 200 according to an example embodiment of the inventive concept. In an embodiment, compared to the memory device 100 of FIG. 1, the memory device 200 of FIG. 3 may include first to fourth memory cell arrays 210A to 210D and may include first to fourth page buffer units 220A to 220D, first to fourth page buffer drivers 221A to 221D, and first to fourth row decoders 230A to 230D corresponding to the first to fourth memory cell arrays 210A to 210D. A peripheral circuit 240 may refer to components included in the memory device 200, except for the first to fourth memory cell arrays 210A to 210D, first to fourth page buffer units 220A to 220D, first to fourth page buffer drivers 221A to 221D, and first to fourth row decoders 230A to 230D.

Referring to FIG. 3, the memory device 200 may include the first to fourth memory cell arrays 210A to 210D which are independently controlled. The first to fourth memory cell arrays 210A to 210D may be connected to the first to fourth page buffer units 220A to 220D respectively. Operations of the first to fourth memory cell arrays 210A to 210D may be independently controlled through the first to fourth page buffer units 220A to 220D, respectively.

The first to fourth page buffer units 220A to 220D may be electrically connected to the first to fourth page buffer drivers 221A to 221D, respectively, to transmit and receive data to and from the outside (e.g., a memory controller) of the memory device 200. The first to fourth page buffer units 220A to 220D may be electrically connected respectively to cache latches that are included in the respective page buffers of the first to fourth page buffer units 220A to 220D. That is, the first to fourth page buffer drivers 221A to 221D may be a portion of a data path connecting the first to fourth page buffer units 220A to 220D respectively thereto to the outside of the memory device 200.

The first to fourth memory cell arrays 210A to 210D may be connected to the first to fourth row decoders 230A to 230D, respectively. The first to fourth memory cell arrays 210A to 210D may independently activate word lines through the first to fourth row decoders 230A to 230D, respectively. Since the first to fourth memory cell arrays 210A to 210D are independently controlled from each other, the first to fourth memory cell arrays 210A to 210D may perform certain operations in parallel or may perform different operations. For example, a read operation could be performed on the first memory cell array 210A while a write operation is performed on the second memory cell array 210B.

The peripheral circuit 240 may receive a command CMD and/or an address ADDR from the outside of the memory device 200 and generate signals respectively corresponding to the first to fourth memory cell arrays 210A to 210D. For example, the peripheral circuit 240 may generate a first word line voltage VWL1, a first row address R_ADDR1, and a first column address C_ADDR1 for the first memory cell array 210A, and may generate a second word line voltage VWL2, a second row address R_ADDR2, and a second column address C_ADDR2 for the second memory cell array 210B. Also, the peripheral circuit 240 may generate a third word line voltage VWL3, a third row address R_ADDR3, and a third column address C_ADDR3 for the third memory cell array 210C, and may generate a fourth word line voltage VWL4, a fourth row address R_ADDR4, and a fourth column address C_ADDR4 for the fourth memory cell array 210D.

According to an example embodiment of the inventive concept, the memory device 200 may be implemented in a COP structure. Accordingly, the first to fourth row decoders 230A to 230D may overlap with the first to fourth memory cell arrays 210A to 210D, respectively, in the third direction Z. In an embodiment, all or some of the peripheral circuit 240 overlaps with the second and fourth row decoders 230B and 230D in the third direction Z. In an embodiment, the first and third memory cell arrays 210A and 210C according to an example embodiment of the inventive concept overlap with all or some of the first to fourth page buffer units 220A to 220D in the third direction Z. Accordingly, a region for disposing the peripheral circuit 240 may be secured, and the degree of integration of the memory device 200 may be improved. Hereinafter, the structure of the memory device 200 is described in detail with reference to FIGS. 4A to 5.

Figure 4A:
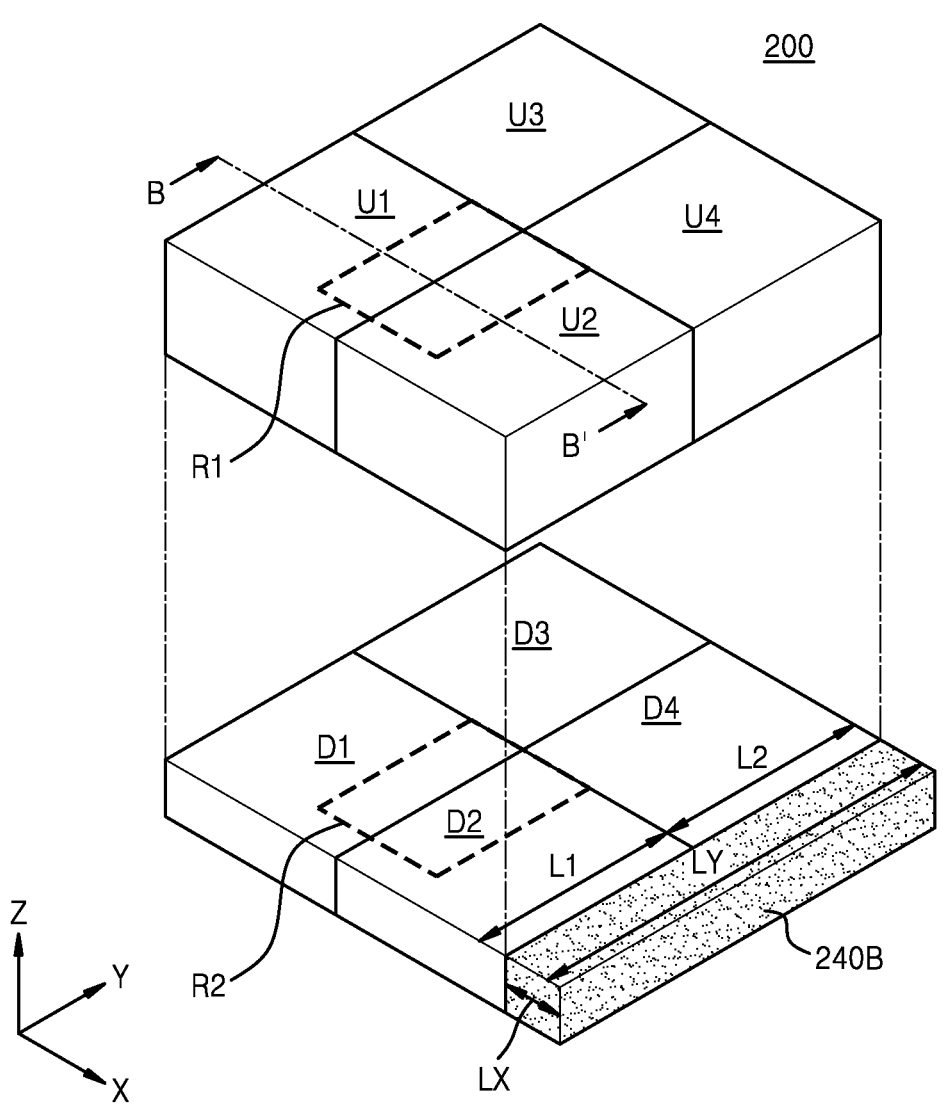
FIGS. 4A to 4C are schematic diagrams illustrating a memory device according to example embodiments of the inventive concept.
Figure 4B:
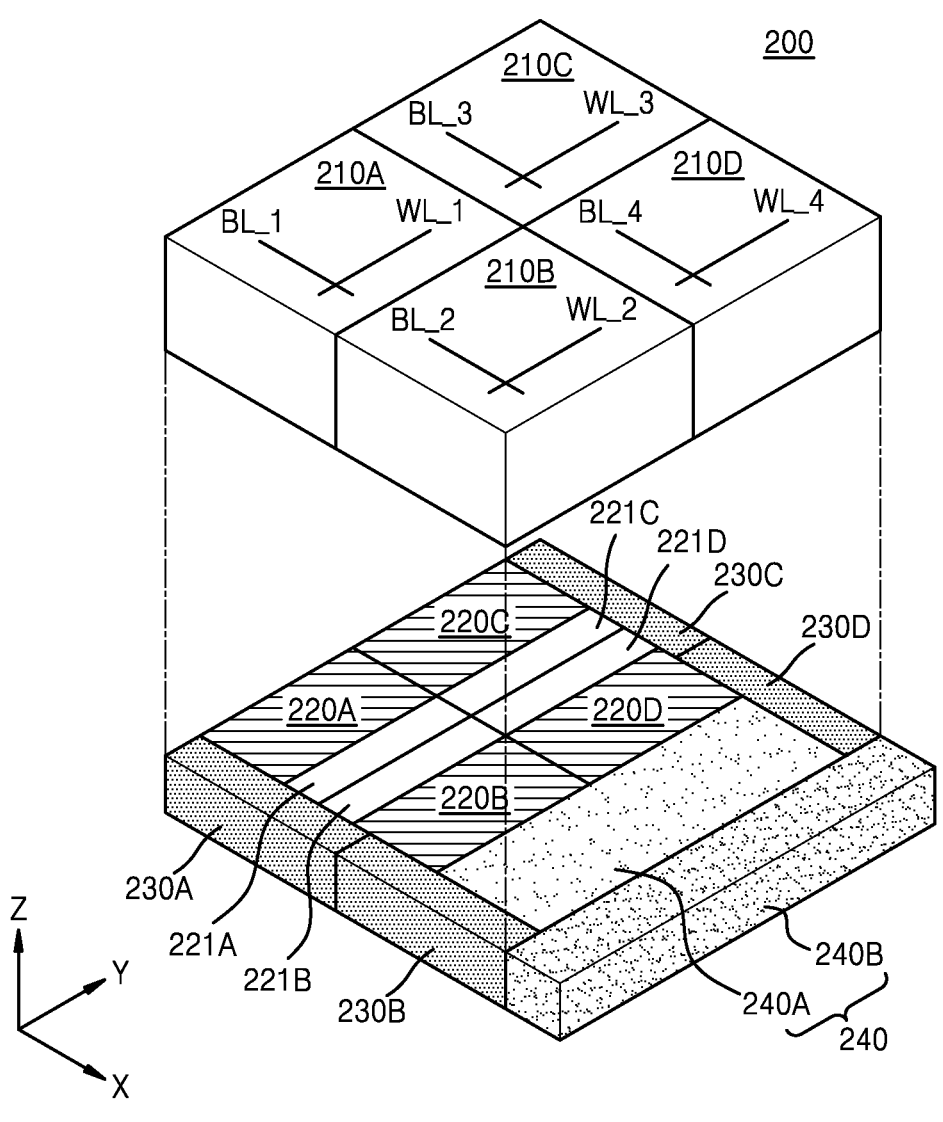
Figure 4C:
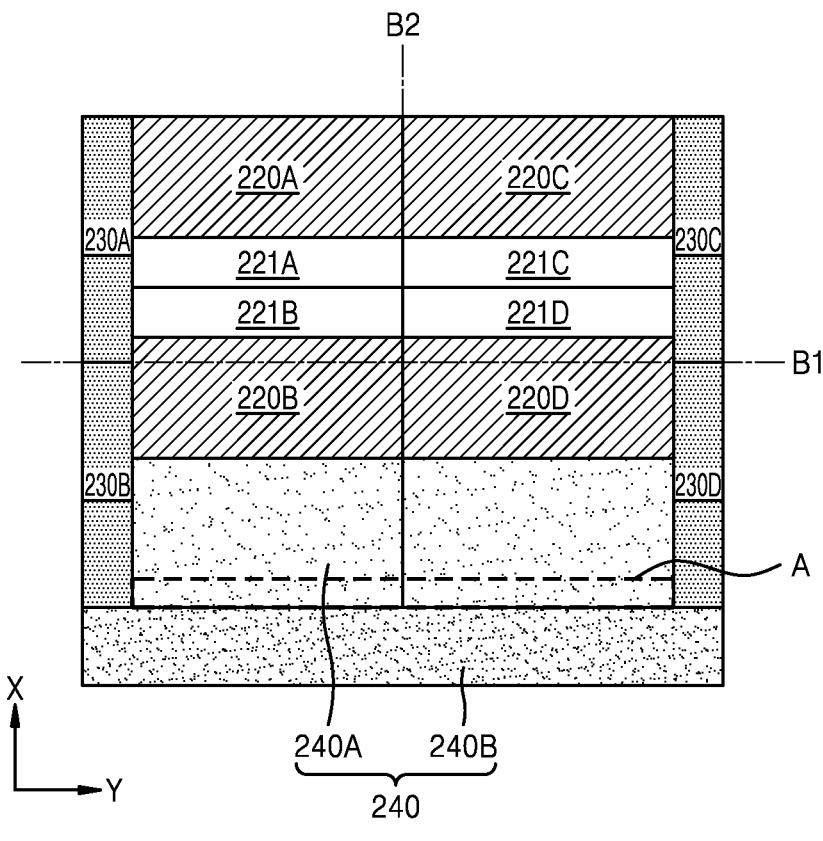

FIGS. 4A to 4C are schematic diagrams illustrating the memory device 200 according to example embodiments of the inventive concept. In detail, FIG. 4A is a schematic diagram illustrating first to fourth upper semiconductor layers U1 to U4 and first to fourth lower semiconductor layers D1 to D4 of the memory device 200 described above with reference to FIG. 3. FIG. 4B is a schematic diagram illustrating the first to fourth memory cell arrays 210A to 210D formed in the first to fourth upper semiconductor layers U1 to U4 and other circuits (e.g., the first to fourth page buffer units 220A to 220D, etc.) formed in the first to fourth lower semiconductor layers D1 to D4. FIG. 4C is a plan view illustrating an upper surface of the first to fourth lower semiconductor layers D1 to D4 in contact with the first to fourth upper semiconductor layers U1 to U4 to illustrate an arrangement of other circuits formed in the first to fourth lower semiconductor layers D1 to D4. Hereinafter, descriptions are given with reference to FIGS. 1 to 3 together.

Referring to FIG. 4A, the memory device 200 may include the first to fourth lower semiconductor layers D1 to D4 and the first to fourth upper semiconductor layers U1 to U4. As described above with reference to FIG. 2, the memory device 200 may have a COP structure in which the first to fourth upper semiconductor layers U1 to U4 are stacked on the first to fourth lower semiconductor layers D1 to D4, respectively. The first to fourth lower semiconductor layers D1 to D4 and the first to fourth upper semiconductor layers U1 to U4 are illustrated as being spaced apart in the third direction Z for convenience of description, but, as illustrated in FIG. 2, upper surfaces of the first to fourth lower semiconductor layers D1 to D4 may be in contact with lower surfaces of the first to fourth upper semiconductor layers U1 to U4.

The first upper semiconductor layer U1 may be disposed adjacent to the second upper semiconductor layer U2 in the first direction X and disposed adjacent to the third upper semiconductor layer U3 in the second direction Y. The second upper semiconductor layer U2 may be disposed adjacent to the fourth upper semiconductor layer U4 in the second direction Y. The third upper semiconductor layer U3 may be disposed adjacent to the fourth upper semiconductor layer U4 in the first direction X.

The first lower semiconductor layer D1 may be disposed adjacent to the second lower semiconductor layer D2 in the first direction X and disposed adjacent to the third lower semiconductor layer (D3) in the second direction Y. The second lower semiconductor layer D2 may be disposed adjacent to the fourth lower semiconductor layer D4 in the second direction Y. The third lower semiconductor layer D3 may be disposed adjacent to the fourth lower semiconductor layer D4 in the first direction X.

An external peripheral circuit 240B may be further disposed adjacent to the second and fourth lower semiconductor layers D2 and D4 in the first direction X. The external peripheral circuit 240B may include some of the circuits not overlapping with the second and fourth upper semiconductor layers U2 and U4 in the third direction Z and corresponding to the peripheral circuit 240. Although not shown in FIG. 4A, as shown in FIGS. 4B and 4C to be described below, the second and fourth lower semiconductor layers D2 and D4 may include an 'internal peripheral circuit 240A' including circuits not included in the external peripheral circuit 240B, among circuits overlapping with the second and fourth upper semiconductor layers U2 and U4 in the third direction Z and corresponding to the peripheral circuit 240.

The external peripheral circuit 240B may include a substrate. Some of the circuits corresponding to the peripheral circuit 240 may be formed in the lower semiconductor layer 10 by forming semiconductor devices such as transistors and patterns for wiring devices on the substrate of the external peripheral circuit 240B. In an embodiment, a length LY of the external peripheral circuit 240B in the second direction Y is equal to the sum of a length L1 of the second lower semiconductor layer D2 in the second direction Y and a length L2 of the fourth lower semiconductor layer D4 in the second direction Y. A length LX of the external peripheral circuit 240B in the first direction X may vary according to a planar area of the internal peripheral circuit (240A in FIG. 4B) formed in the second and fourth lower semiconductor layers D2 and D4. For example, as the planar area of the internal peripheral circuit 240A (240A in FIG. 4B) increases, the length LX of the external peripheral circuit 240B in the first direction X may decrease. Accordingly, the degree of integration of the memory device 200 may be improved.

Referring to FIGS. 4B and 4C, first to fourth memory cell arrays 210A to 210D may be formed in the first to fourth upper semiconductor layers U1 to U4. As described above with reference to FIG. 3, the first to fourth memory cell arrays 210A to 210D may be independently controlled and may be connected to the first to fourth page buffer units 220A to 220D, the first to fourth page buffer drivers 221A to 221D, and the first to fourth row decoders 230A to 230D, respectively. For example, the first memory cell array 210A may be connected to the first page buffer unit 220A, the first page buffer driver 221A, and the first row decoder 230A.

The first to fourth page buffer units 220A to 220D, the first to fourth page buffer drivers 221A to 221D, the first to fourth row decoders 230A to 230D, and the internal peripheral circuit 240A may be formed in the first to fourth lower semiconductor layers D1 to D4. In FIG. 4C, a first boundary B1 may refer to a boundary between the first and second lower semiconductor layers D1 and D2 and a boundary between the third and fourth lower semiconductor layers D3 and D4, and a second boundary B2 may refer to a boundary between the first and third lower semiconductor layers D1 and D3 and a boundary between the second and fourth lower semiconductor layers D2 and D4.

The first to fourth row decoders 230A to 230D may be disposed in the first to fourth lower semiconductor layers D1 to D4, respectively, and may extend in the first direction X perpendicular to the direction in which the word lines WL extend. In an embodiment, the first to fourth row decoders 230A to 230D each have a length in the first direction X equal or substantially equal to a length of each of the first to fourth memory cell arrays 210A to 210D in the first direction X.

The first and second row decoders 230A and 230B may be disposed adjacent to each other in the first direction X, and the third and fourth row decoders 230C and 230D may be disposed adjacent to each other in the first direction X. The first and second row decoders 230A and 230B may be spaced apart from the third and fourth row decoders 230C and 230D in the second direction Y. However, the inventive concept is not limited thereto, and the arrangement of the first to fourth row decoders 230A to 230D may be variously changed. Various embodiments of the arrangement of the first to fourth row decoders 230A to 230D are described below with reference to FIGS. 7A to 7C.

The first to fourth page buffer units 220A to 220D may be disposed in the first to fourth lower semiconductor layers D1 to D4 and may be disposed to extend in the second direction Y perpendicular to the bit lines BL. Circuits corresponding to the first page buffer unit 220A may be disposed in the first lower semiconductor layer D1, and circuits corresponding to the third page buffer unit 220C may be disposed in the third lower semiconductor layer D3. Circuits corresponding to the second and fourth page buffer units 220B and 220D may be separately disposed in the first to fourth lower semiconductor layers D1 to D4.

The first page buffer unit 220A and the second page buffer unit 220B may be disposed to be spaced apart from each other in the first direction X. The first lower semiconductor layer D1 may include circuits corresponding to the first page buffer unit 220A and may include at least some of circuits corresponding to the second page buffer unit 220B. The second lower semiconductor layer D2 may include others of circuits corresponding to the second page buffer unit 220B. That is, the second lower semiconductor layer D2 may include circuits not included in the first lower semiconductor layer D1 among circuits corresponding to the second page buffer unit 220B. For example, some of the circuits of the second page buffer unit 220B may be disposed in the second lower semiconductor layer D2 and the remaining circuits of the second page buffer unit 220B may be disposed in the first lower semiconductor layer D1.

The first page buffer driver 221A and the second page buffer driver 221B may be disposed between the first page buffer unit 220A and the second page buffer unit 220B and extend in the second direction Y. The first page buffer driver 221A may be disposed adjacent to the second page buffer driver 221B in the first direction X. In an embodiment, the first page buffer driver 221A is disposed closer to the first page buffer unit 220A than to the second page buffer unit 220B, and the second page buffer driver 221B is disposed closer to the second page buffer unit 220B than to the first page buffer unit 220A.

The third page buffer unit 220C may be disposed to be spaced apart from the fourth page buffer unit 220D in the first direction X. The third lower semiconductor layer D3 may include circuits corresponding to the third page buffer unit 220C and may include at least some of circuits corresponding to the fourth page buffer unit 220D. The fourth lower semiconductor layer D4 may include others of the circuits corresponding to the fourth page buffer unit 220D. That is, the fourth lower semiconductor layer D4 may include circuits not included in the third lower semiconductor layer D3 among circuits corresponding to the fourth page buffer unit 220D. For example, some of the circuits of the fourth page buffer unit 220D may be disposed in the fourth lower semiconductor layer D4 and the remaining circuits of the fourth page buffer unit 220D may be disposed in the third lower semiconductor layer D3.

The third page buffer driver 221C and the fourth page buffer driver 221D may be disposed between the third page buffer unit 220C and the fourth page buffer unit 220D and extend in the second direction Y. The third page buffer driver 221C and the fourth page buffer driver 221D may be disposed adjacent to each other in the first direction X. In an embodiment, the third page buffer driver 221C is disposed closer to the third page buffer unit 220C than to the fourth page buffer unit 220D, and the fourth page buffer driver 221D is disposed closer to the fourth page buffer unit 220D than to the third page buffer unit 220C.

The first and second page buffer units 220A and 220B and the third and fourth page buffer units 220C and 220D may be symmetrical with respect to the second boundary B2. The first and second page buffer drivers 221A and 221B and the third and fourth page buffer drivers 221C and 221D may be disposed to be symmetrical with respect to the second boundary B2.

The peripheral circuit 240 may include the internal peripheral circuit 240A overlapping with the second and fourth upper semiconductor layers U2 and U4 in the third direction Z, and the external peripheral circuit 240B not overlapping with the second and fourth upper semiconductor layers U2 and U4 in the third direction Z. The internal peripheral circuit 240A may be formed in the second lower semiconductor layer D2 and the fourth lower semiconductor layer D4. That is, the second lower semiconductor layer D2 may include some of circuits corresponding to the internal peripheral circuit 240A, and the fourth lower semiconductor layer D4 may include others of the circuits corresponding to the internal peripheral circuit 240A. The internal peripheral circuit 240A may include the voltage generator (141 in FIG. 1), the error correction circuit (142 in FIG. 1), the scheduler (143 in FIG. 1), the command decoder (144 in FIG. 1), and the address decoder (145 in FIG. 1).

According to an embodiment of the inventive concept, since the first lower semiconductor layer D1 includes at least a portion of the second page buffer unit 220B, a planar width of the internal peripheral circuit 240A may be expanded. For example, the portion of the second page buffer unit 220B could include some page buffers of the second page buffer unit 220B. Also, since the third lower semiconductor layer D3 includes at least a portion of the fourth page buffer unit 220D, a planar width of the inner peripheral circuit 240A may be expanded. For example, the portion of the fourth page buffer unit 220D could include some page buffers of the fourth page buffer unit 220D. That is, an expansion region A of the inner peripheral circuit 240A may be secured to be larger, and since the planar width of the external peripheral circuit 240B in the first direction X is implemented to be small, the degree of integration of the memory device 200 may be improved. For example, the planar width of a peripheral circuit in the first direction X may be reduced by the planar width of the expansion region A to form the external peripheral circuit 240B. Hereinafter, the memory device 200 is described in detail with reference to a cross-sectional view of the memory device 200.

Figure 5:
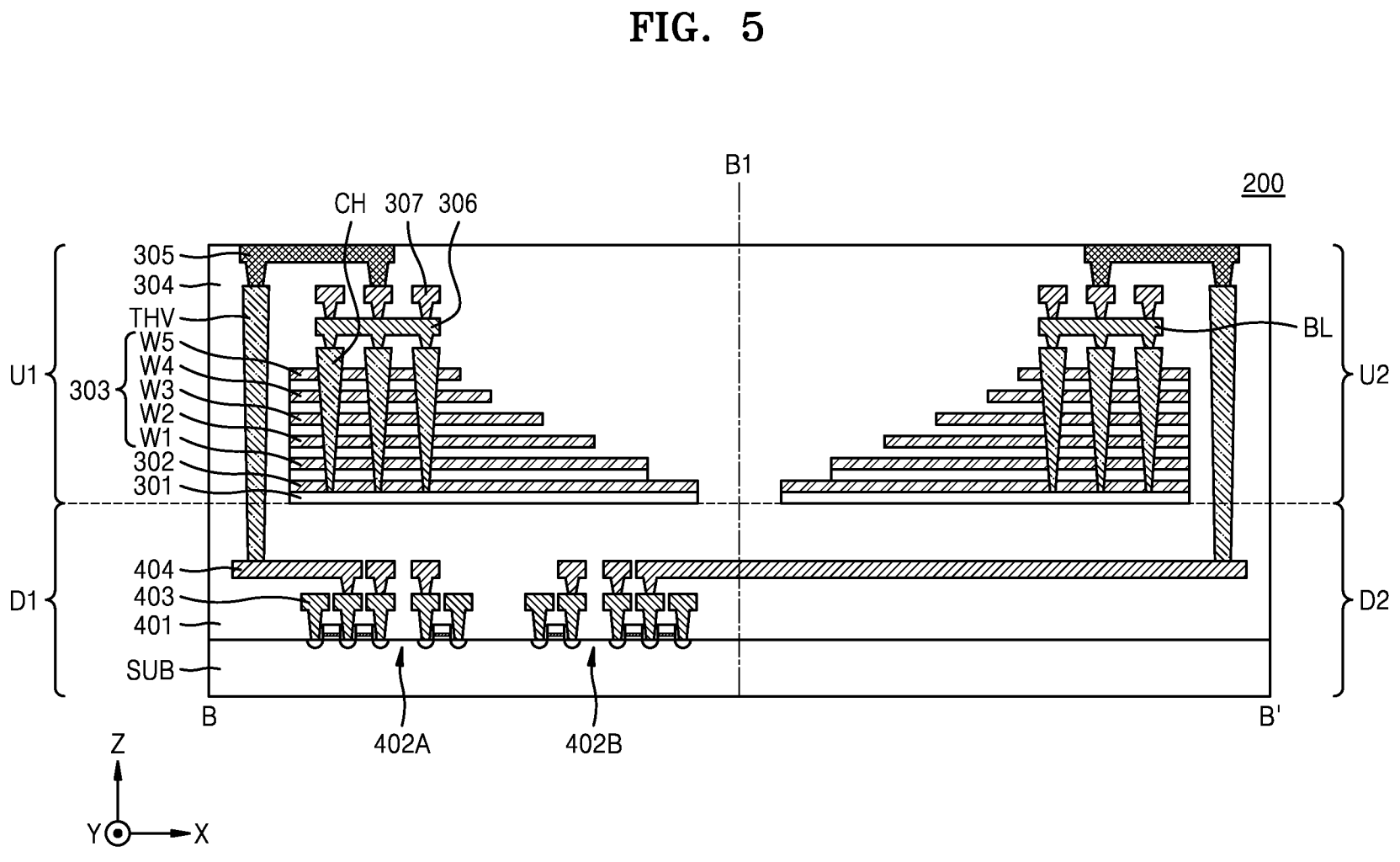

FIG. 5 is a schematic diagram illustrating a cross-section of a memory device according to an example embodiment of the inventive concept. In detail, FIG. 5 is a schematic cross-sectional view of the first and second upper semiconductor layers U1 and U2 and the first and second lower semiconductor layers D1 and D2 of FIG. 4A taken along line B-B', illustrating an example of a structure for electrically connecting an upper semiconductor layer to a lower semiconductor layer. Hereinafter, descriptions are given with reference to FIGS. 1 to 4C, and the same reference numerals denote the same components.

Referring to FIG. 5, the memory device 200 may include a first upper semiconductor layer U1, a second upper semiconductor layer U2 adjacent to the first upper semiconductor layer U1 in the first direction X, a first lower semiconductor layer D1 formed below the first upper semiconductor layer U1 and overlapping with the first upper semiconductor layer U1 in the third direction Z, and a second lower semiconductor layer D2 formed below the second upper semiconductor layer U2 and overlapping with the second upper semiconductor layer U2 in the third direction Z.

The first upper semiconductor layer U1 may be formed on the first lower semiconductor layer D1. The first upper semiconductor layer U1 and the first lower semiconductor layer D1 may be formed on the same substrate SUB and may be implemented in a CoP structure. The second upper semiconductor layer U2 may be formed on the second lower semiconductor layer D2. The second upper semiconductor layer U2 and the second lower semiconductor layer D2 may be formed on the same substrate SUB, and may be implemented in a CoP structure. The first upper semiconductor layer U1 and the second upper semiconductor layer U2 may include the same components, and thus, only the first upper semiconductor layer U1 is described and description of the second upper semiconductor layer U2 is omitted.

The first upper semiconductor layer U1 may include at least one memory block. The first upper semiconductor layer U1 may include a lower insulating film 301. A common source line 302 covering an upper surface of the lower insulating film 301 may be formed on the lower insulating film 301. A plurality of word lines W1 to W5 (collectively referred to as 303) may be stacked on the common source line 302 in the third direction Z perpendicular to an upper surface of the common source line 302. In FIG. 5, only five word lines 303 are illustrated, but the inventive concept is not limited thereto. In addition, although not shown in FIG. 5, string select lines and a ground select line may be further disposed above and below each of the word lines 303, and a plurality of word lines 303 may be disposed between the string select lines and the ground select line.

The first upper semiconductor layer U1 may include a through-via THV formed to be spaced apart from the lower insulating film 301, the common source line 302, and the word lines 303, and extending in the third direction Z to pass through an interlayer insulating layer 304. A bonding metal 305 (e.g., a conductor) may be formed on the through-via THV, and the bonding metal 305 may be electrically connected to the first metal layer 306 and the second metal layer 307 formed on a channel structure CH.

The channel structure CH may extend in the third direction Z and pass through the word lines 303, string select lines, and ground select line. The channel structure CH may include a data storage layer, a channel layer, and a buried insulating layer, and the channel layer may be electrically connected to the first metal layer 306 and the second metal layer 307. The first metal layer 306 formed on the channel structure CH may be a bit line, and the second metal layer 307 formed on the channel structure CH may be a bit line contact. The first metal layer 306 formed on the channel structure CH, that is, the bit line, may extend in the first direction X, and the word lines 303 may extend in the second direction Y. The first metal layer 306 and the second metal layer 307 may be electrically connected to first semiconductor devices 402A formed in the first lower semiconductor layer D1 through the bonding metal 305 and the through-via THV. For example, the first metal layer 306 and the second metal layer 307 may be connected to semiconductor devices formed in the first lower semiconductor layer D1 and provide connections to the row decoder (230A in FIG. 4C) through the bonding metal 305 and the through-via THV.

The first lower semiconductor layer D1 may include a substrate SUB, an interlayer insulating layer 401 formed on the substrate SUB, a plurality of semiconductor devices 402A and 402B formed on the substrate SUB, a first metal layer 403 connected to each of the semiconductor devices 402A and 402B, and a second metal layer 404 formed on the first metal layer 403.

The substrate SUB may be a semiconductor substrate including a semiconductor material such as single crystal silicon or single crystal germanium, and may be manufactured from a silicon wafer.

The interlayer insulating layer 401 may be formed on the substrate SUB to cover the semiconductor devices 402A and 402B, the first metal layer 403, and the second metal layer 404. The interlayer insulating layer 401 may include an insulating material such as silicon oxide or silicon nitride. The interlayer insulating layer 401 may be formed through a chemical vapor deposition (CVD) process, a spin coating process, or the like.

The first metal layer 403 may be formed on source/drain regions of the plurality of semiconductor devices 402A and 402B formed on the substrate SUB. The first metal layer 403 may be formed of a material having a relatively higher electrical resistivity than the second metal layer 404. For example, the first metal layer 403 may be formed of tungsten, and the second metal layer 404 may be formed of copper. Although only the first metal layer 403 and the second metal layer 404 are illustrated in FIG. 5, the inventive concept is not limited thereto, and at least one metal layer may be further formed on the second metal layer 404. At least some of the one or more metal layers formed on the second metal layer 404 may be formed of a material having a lower electrical resistivity than the second metal layer 404. For example, at least some of the one or more metal layers formed on the second metal layer 404 may be formed of aluminum.

The semiconductor devices 402A and 402B may include first semiconductor devices 402A and second semiconductor devices 402B. The first semiconductor devices 402A may constitute a circuit corresponding to the first page buffer unit 220A of FIG. 4C connected to the first upper semiconductor layer U1. The first metal layer 403 and the second metal layer 404 may be formed on the semiconductor devices 402A constituting the first page buffer unit 220A of FIG. 4C, and the second metal layer 404 may be connected to the through-via THV formed in the first upper semiconductor layer U1. Accordingly, the semiconductor devices 402A constituting the first page buffer unit 220A of FIG. 4C may be electrically connected to the bit line 306 of the first upper semiconductor layer U1.

The second semiconductor devices 402B may constitute a circuit corresponding to at least a portion of the second page buffer unit (220B of FIG. 4C) connected to the second upper semiconductor layer U2. The first metal layer 403 and the second metal layer 404 may be formed on the semiconductor devices 402B constituting at least a portion of the second page buffer unit 220B of FIG. 4C, and the second metal layer 404 may be connected to the through-via THV formed in the second upper semiconductor layer U2. Accordingly, the semiconductor devices 402B constituting at least a portion of the second page buffer unit 220B of FIG. 4C may be electrically connected to the bit line BL of the second upper semiconductor layer U2.

FIGS. 6A to 6D are plan views illustrating an upper surface of a portion of an upper semiconductor layer and an upper surface of a portion of a lower semiconductor layer according to example embodiments of the inventive concept. In detail, FIGS. 6A to 6D are plan views illustrating upper surfaces of the first and second upper semiconductor layers U1 and U2 corresponding to a first region R1 of FIG. 4A and upper surfaces of the first and second lower semiconductor layers D1 and D2 corresponding to a second region R2 of FIG. 4A. The first region R1 and the second region R2 may overlap with in the third direction Z.

The first region R1 includes a portion of the first memory cell array 210A and a portion of the second memory cell array 210B, and the second region R2 includes the entire second page buffer unit 220B and a portion of the second page buffer driver 221B. FIGS. 6A to 6D show different embodiments of the second page buffer unit 220B, and the first region R1 and the second region R2 are illustrated to be spaced apart from each other in the second direction Y, but this may be understood for the convenience of description. In addition, as described above with reference to FIG. 4C, the first boundary B1 in FIGS. 6A to 6D may refer to a boundary between the first and second upper semiconductor layers U1 and U2 and between the first and second lower semiconductor layers D1 and D2. Hereinafter, descriptions are given with reference to FIGS. 1 to 5 together, and a subscript (e.g., a in 220Ba, a in U1a, etc.) attached to the end of a reference sign is used to distinguish between a plurality of circuits performing the same function.

Figure 6A:
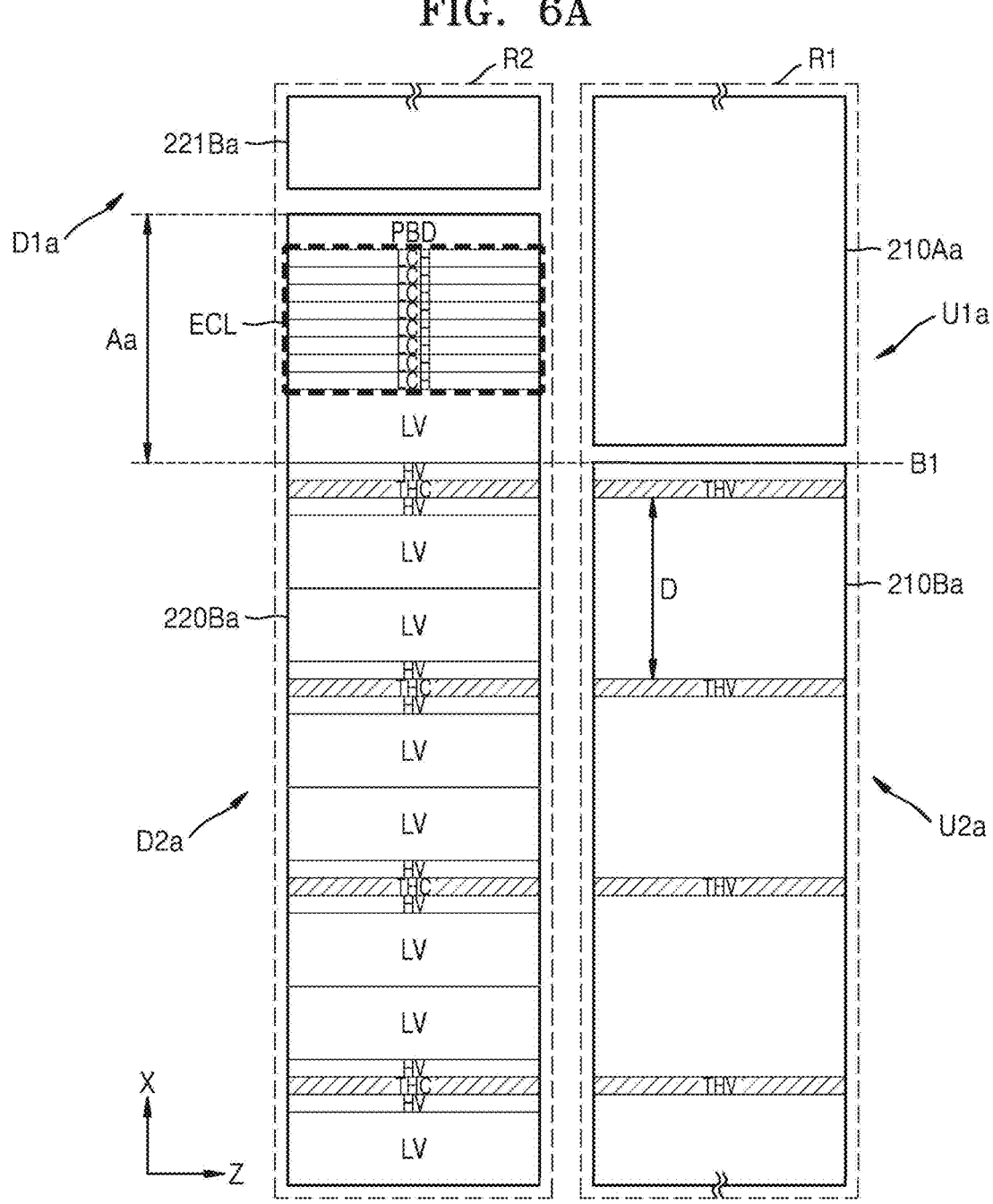
FIGS. 6A to 6D are plan views illustrating an upper surface of an upper semiconductor layer and an upper surface of a lower semiconductor layer according to example embodiments of the inventive concept.

Referring to FIG. 6A, the second upper semiconductor layer U2a may include a plurality of through-vias THV. The through-vias THV may be disposed to be spaced apart from each other at regular intervals D in the first direction X. The through-vias THV may pass through a second memory cell array 210B a to be connected to the second page buffer unit 220B a.

The second page buffer unit 220Ba may include through-via contacts THC, cache latches LCH, a page buffer decoder PBD, a low voltage operation unit LV (e.g., a low voltage circuit), and a high voltage operation unit HV (e.g., a high voltage circuit). Circuits corresponding to the second page buffer unit 220Ba may be separately disposed in a first lower semiconductor layer D1a and a second lower semiconductor layer D2a. The cache latches LCH are included in page buffers of the page buffer unit and are controlled by the page buffer driver.

The through-via contacts THC may include a plurality of contacts overlapping with the through-vias THV in a vertical direction and connected to the through-vias THV. Accordingly, the through-via contacts THC may be disposed to be spaced apart from each other at regular intervals D in the first direction X, like the through-vias THV. A bit line of the second memory cell array 210Ba may be electrically connected to the second page buffer unit 220Ba since the through-via contacts THC are connected to the through vias THV. The through-via contacts THC may be disposed in the second lower semiconductor layer D2a.

The cache latches LCH may store data programmed into or read from the memory cell array 210Ba. The cache latches LCH may be disposed at an edge of the second page buffer unit 220Ba to be adjacent to the second page buffer driver 221Ba. The cache latches LCH disposed at the edge of the second page buffer unit 220Ba to be adjacent to the second page buffer driver 221Ba may be referred to as an 'edge cache latch unit ECL' (e.g., one or more latches). That is, the second page buffer unit 220Ba may include an edge cache latch unit ECL. The edge cache latch unit ECL may be disposed in the first lower semiconductor layer D1a. The edge cache latch unit ECL may overlap with the first upper semiconductor layer U1 a in a vertical direction.

The page buffer decoder PBD may control the cache latches LCH. For example, the cache latches LCH may receive data to be programmed into the second memory cell array 210Ba from the page buffer decoder PBD. The page buffer decoder PBD may be disposed adjacent to the edge cache latch unit ECL in the first direction X, and may be disposed at the outermost edge of the second page buffer unit 220Ba. The page buffer decoder PBD may be disposed in the first lower semiconductor layer D1 a. The page buffer decoder PBD may overlap with the first upper semiconductor layer U1 a in a vertical direction. In FIG. 6A, the page buffer decoder PBD is illustrated as being included in the second page buffer unit 220Ba, but is not limited thereto. For example, the page buffer decoder PBD may be located outside the second page buffer unit 220Ba.

The high voltage operation unit HV may include at least one transistor or a plurality of transistors operating based on a high voltage. The high voltage operation unit HV may be disposed adjacent to the through-via contacts THC in the first direction X. Two high voltage operation units HV may be disposed for each of the through-via contacts THC, and the two high voltage operation units HV may be disposed to be spaced apart from each other with a through-via contact therebetween. The high voltage operation unit HV may be disposed in the second lower semiconductor layer D2a.

The low voltage operation unit LV may include at least one transistor or a plurality of transistors operating based on a low voltage. The low voltage operation unit LV may be disposed adjacent to the edge cache latch unit ECL and may be disposed between the high voltage operation units HV. For example, some low voltage operation units LV may be disposed between a pair of the high voltage operation units HV. The low voltage operation unit LV disposed closest to the edge cache latch unit ECL may overlap with the first upper semiconductor layer U1 a in a vertical direction. The low voltage operation unit LV disposed closest to the edge cache latch unit ECL may be disposed in the first lower semiconductor layer D1 a, and the other low voltage operation units LV may be disposed in the second lower semiconductor layer D2 a. In an embodiment, the low voltage operation unit LV occupies a larger region in the second page buffer unit 220Ba than the high voltage operation unit HV.

According to an embodiment of the inventive concept, the first lower semiconductor layer D1a includes the page buffer decoder PBD, the edge cache latch unit ECL, and the low voltage operation unit LV disposed closest to the edge cache latch unit ECL of the second page buffer unit 220Ba. The page buffer decoder PBD, the edge cache latch unit ECL, and the low voltage operation unit LV disposed closest to the edge cache latch unit ECL formed in the first lower semiconductor layer D1a may have a planar area as large as an expansion region Aa in the first lower semiconductor layer D1a. Accordingly, the internal peripheral circuit (240A in FIG. 4C) formed adjacent to the second page buffer unit 220Ba of the second lower semiconductor layer D2a in the first direction X may additionally secure the expansion region A. Since the expansion region A is secured to be larger, a size of the external peripheral circuit 240B in the first direction may be formed smaller, so that the degree of integration of the memory device 200 in FIG. 4C may be improved.

In an embodiment according to the inventive concept, only the second page buffer unit 220Ba is shown, but the fourth page buffer unit (220D in FIG. 4C) disposed adjacent to the second page buffer unit 220Ba in the second direction Y may have the same structure as that of the second page buffer unit 220Ba. That is, the fourth page buffer unit 220D of FIG. 4C may include the edge cache latch unit ECL. Also, the first and third page buffer units 220A and 220C in FIG. 4C may have the same structure. For example, the first and third page buffer units 220A and 220C of FIG. 4C may include an edge cache latch unit ECL.

Figure 6B:
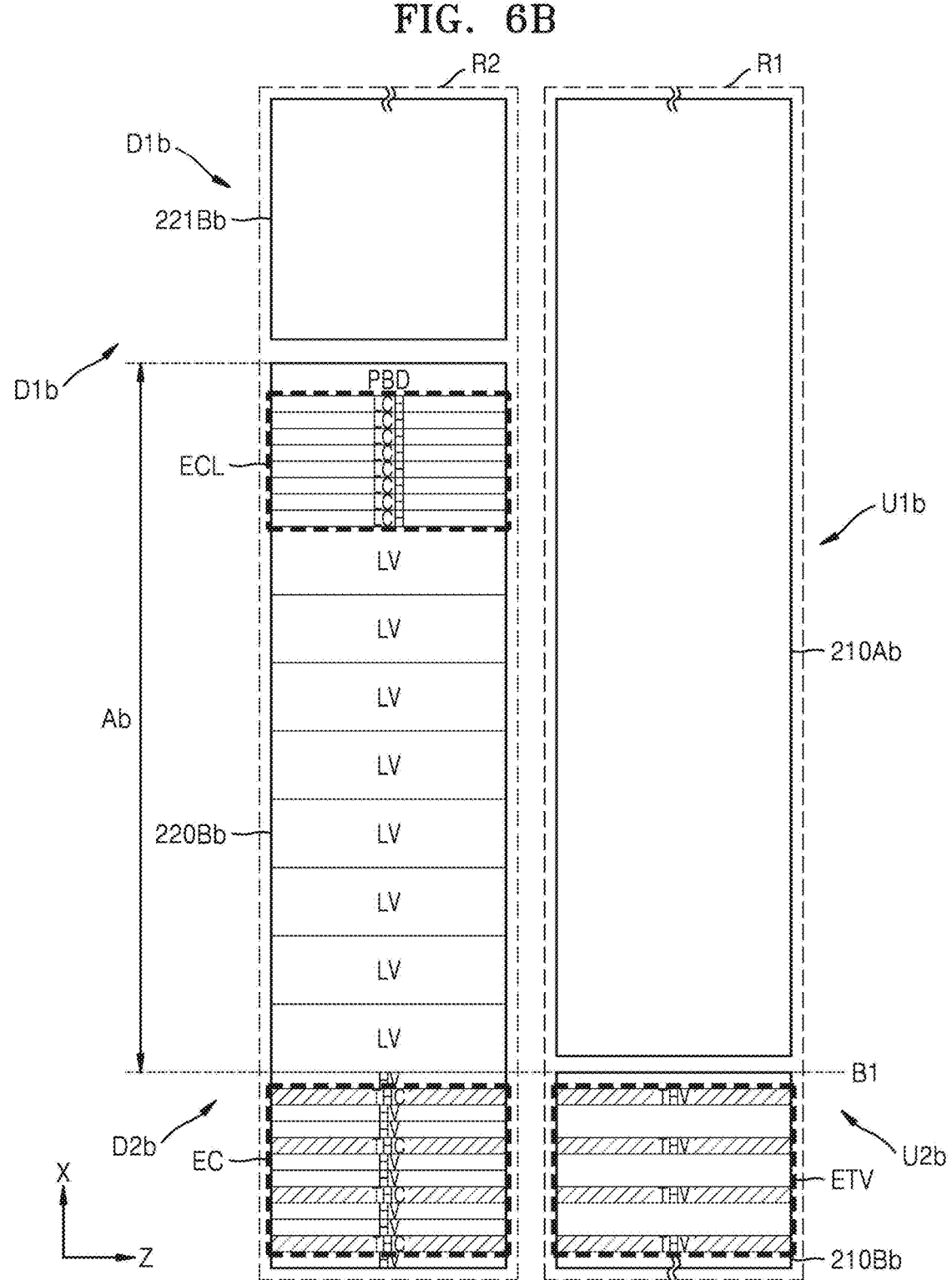

Referring to FIG. 6B, the arrangement of the high voltage operation unit HV, the low voltage operation unit LV, and the through-via contacts THC is different from that of the second page buffer unit 220Ba of FIG. 6A. Hereinafter, differences from FIG. 6A are mainly described.

A second upper semiconductor layer U2b may include a plurality of through-vias THV. The through-vias THV may be disposed at an edge of the second upper semiconductor layer U2b to be adjacent to a first upper semiconductor layer U1b and pass through the second memory cell array 210Bb to be connected to the second page buffer unit 220Bb. For example, a first one of the through-vias THV may be connected to a first page buffer of the second page buffer unit 220Bb, a second one of the through-vias THV may be connected to a second page buffer of the second page buffer unit 220Bb, etc. The through-vias THV disposed at an edge of the second upper semiconductor layer U2b to be adjacent to the first upper semiconductor layer U1b may be referred to as an 'edge through-via portion ETV'. That is, the second upper semiconductor layer U2b may include the edge through-via portion ETV.

The second page buffer unit 220Bb may include a page buffer decoder PBD, an edge cache latch unit ECL, through-via contacts THC, a low voltage operation unit LV, and a high voltage operation unit HV.

The through-via contacts THC may include a plurality of contacts overlapping with the through-vias THV in a vertical direction and connected to the through-vias THV. The through-via contacts THC may be disposed at an edge of the second page buffer unit 220Bb to be adjacent to the internal peripheral circuit 240A of FIG. 4C. An interval between the through-via contacts THC may be equal to an interval between the through-vias THV.

The high voltage operation unit HV may be disposed at an edge of the second page buffer unit 220Bb to be adjacent to the internal peripheral circuit 240A of FIG. 4C. The through-via contacts THC disposed at the edge of the second page buffer unit 220Bb adjacent to the internal peripheral circuit 240A of FIG. 4C may be referred to as an 'edge contact portion EC'. That is, the second page buffer unit 220Bb may include the edge contact portion EC.

The high voltage operation unit HV may be disposed adjacent to the through-via contacts THC in the first direction X. Two high voltage operation units HV may be disposed for each of the through-via contacts THC, and the two high voltage operation units HV may be disposed with a through-via contact therebetween. For example, when four through-via contacts THC are disposed in the second page buffer unit 220Bb, a total of eight high-voltage operation units HV may be disposed adjacent to four through-via contacts THC in the first direction X. The high voltage operation unit HV may be disposed in the second lower semiconductor layer D2b together with the through-via contacts THC. For example, two high-voltage operation units HV may be disposed between a pair of the through-via contacts THC.

The low voltage operation unit LV may be disposed between the edge cache latch unit ECL and the high voltage operation unit HV. The low voltage operation unit LV may be disposed in the first lower semiconductor layer D1 b together with the edge cache latch unit ECL. Accordingly, the low voltage operation unit LV and the edge cache latch unit ECL may overlap with the first upper semiconductor layer U1 b in a vertical direction.

According to an embodiment of the inventive concept, the first lower semiconductor layer D1b may include the page buffer decoder PBD, the edge cache latch unit ECL, and the low voltage operation unit LV of the second page buffer unit 220Bb. The page buffer decoder PBD, the edge cache latch unit ECL, and the low voltage operation unit LV formed in the first lower semiconductor layer D1b may have a planar area as large as an expansion region Ab in the first lower semiconductor layer D1b. Accordingly, the internal peripheral circuit 240A of FIG. 4C may additionally secure the expansion region Ab formed adjacent to the second page buffer unit 220Bb of the second lower semiconductor layer D2b in the first direction X.

In an embodiment according to the inventive concept, only the second page buffer unit 220Bb is illustrated, but the fourth page buffer unit 220D of FIG. 4C may have the same structure as that of the second page buffer unit 220Bb. That is, the fourth page buffer unit 220D of FIG. 4C may include an edge cache latch unit ECL and an edge contact portion EC. Also, the first and third page buffer units 220A and 220C in FIG. 4C may have the same structure as that of the second page buffer unit 220Bb.

Figure 6C:
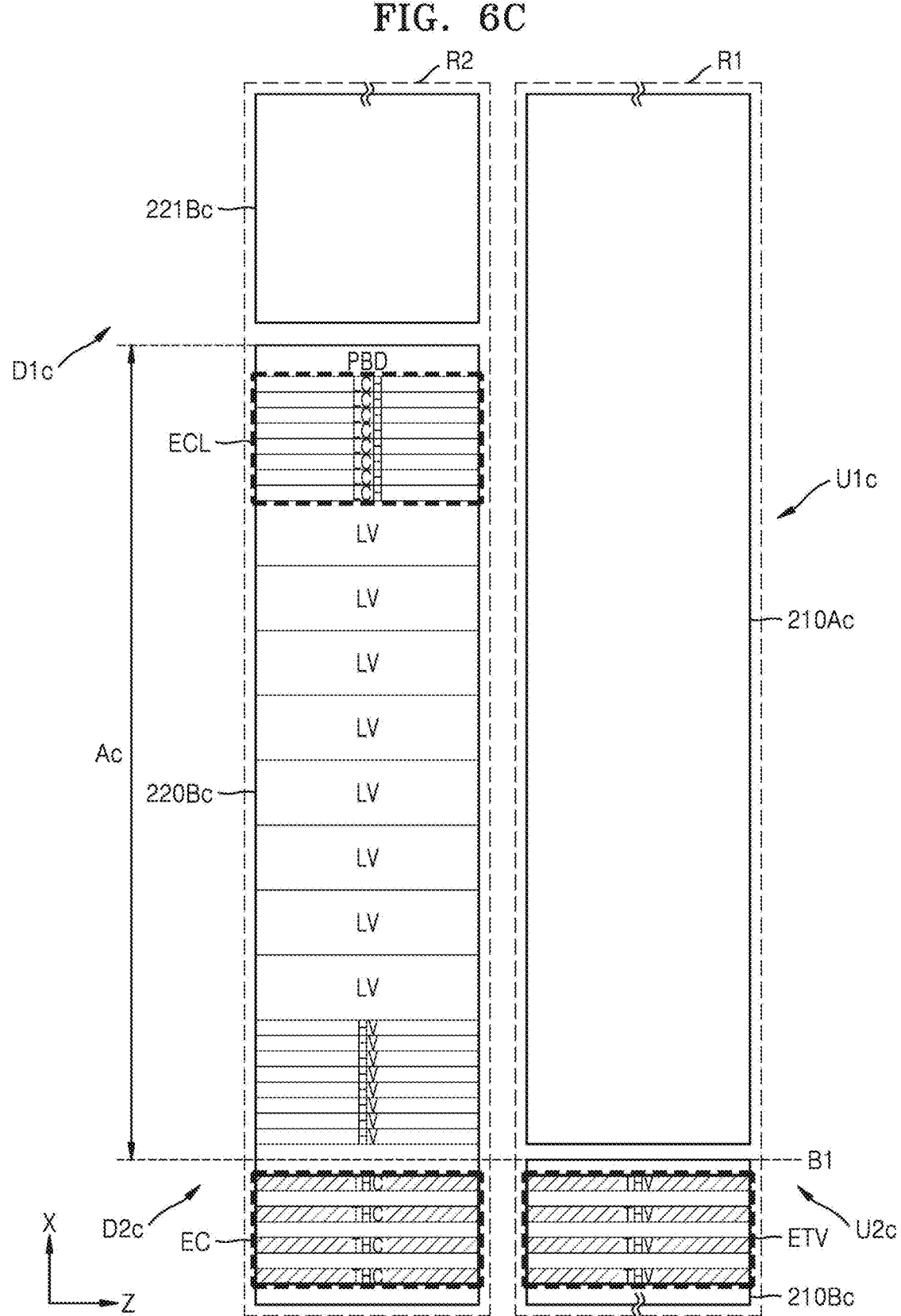

Referring to FIG. 6C, there is a difference in the arrangement of the high voltage operation unit HV compared to the second page buffer unit 220Bb of FIG. 6B. Hereinafter, differences from FIG. 6B are mainly described.

The second page buffer unit 220Bc may include a page buffer decoder PBD, an edge cache latch unit ECL, an edge contact portion EC, a low voltage operation unit LV, and a high voltage operation unit HV.

The second page buffer unit 220Bc may include an edge contact portion EC. The second page buffer unit 220Bc is different from the second page buffer unit 220Bb of FIG. 6B since semiconductor devices are not disposed between the through-via contacts THC included in the edge contact portion EC. That is, only the through-via contacts THC are disposed at the edge of the second page buffer unit 220Bc apart from the edge cache latch unit ECL. Accordingly, an interval between the through-via contacts THC may be reduced. Because the interval between the through-vias THV is equal to the interval between the through-via contacts THC, a length of the 'edge through-via portion ETV' formed in the second upper semiconductor layer U2c in the first direction X may be formed to be shorter. The edge contact part EC may be disposed on the second lower semiconductor layer D2c.

The high voltage operation unit HV may be disposed adjacent to the edge contact portion EC in the first direction X. The high voltage operation unit HV may be disposed adjacent to each other in the first direction X. The high voltage operation unit HV may be disposed between the low voltage operation unit LV and the edge contact portion EC. The high voltage operation unit HV may be disposed in the first lower semiconductor layer D1 c together with the edge cache latch unit ECL and the low voltage operation unit LV. Accordingly, the high voltage operation unit HV, the low voltage operation unit LV, and the edge cache latch unit ECL may overlap with the first upper semiconductor layer U1 c in a vertical direction.

According to an embodiment of the inventive concept, a first lower semiconductor layer D1c may include the page buffer decoder PBD, the edge cache latch unit ECL, the low voltage operation unit LV, and the high voltage operation unit HV of the second page buffer unit 220Bc. The page buffer decoder PBD, the edge cache latch unit ECL, the low voltage operation unit LV and the high voltage operation unit HV formed in the first lower semiconductor layer D1c may have a planar area as large as an expansion region Ac in the first lower semiconductor layer D1c. Accordingly, the internal peripheral circuit 240A of FIG. 4C formed adjacent to the second page buffer unit 220Bc of the second lower semiconductor layer D2c in the first direction X may additionally secure the expansion region Ac.

In an embodiment according to the inventive concept, only the second page buffer unit 220Bc is shown, but the fourth page buffer unit 220D of FIG. 4C may have the same structure as that of the second page buffer unit 220Bc. Also, the first and third page buffer units 220A and 220C in FIG. 4C may have the same structure as that of the second page buffer unit 220Bc.

Figure 6D:
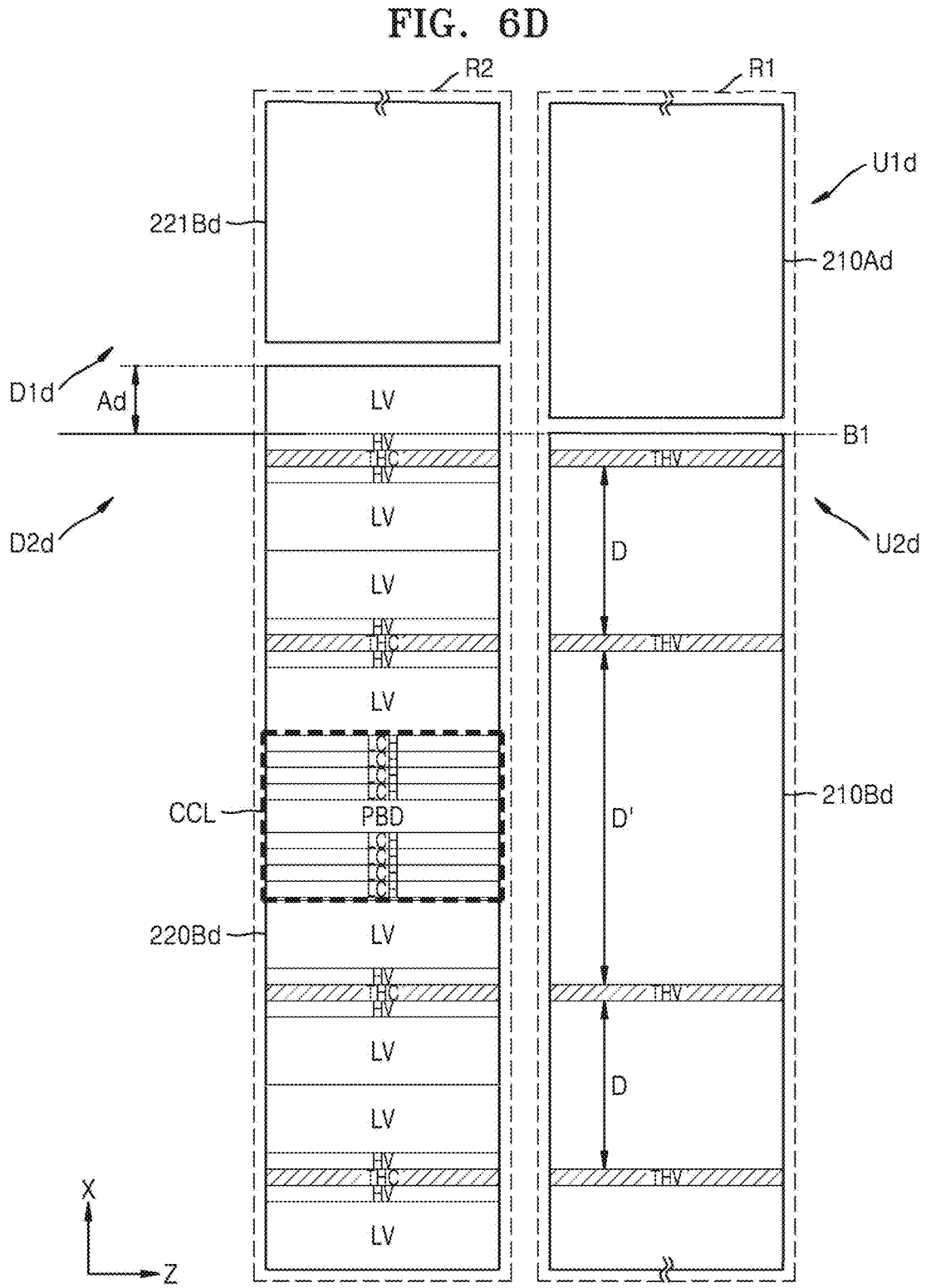

Referring to FIG. 6D, there is a difference in arrangement of the cache latches LCH and the page buffer decoder PBD, compared to the second page buffer unit 220Ba of FIG. 6A. Hereinafter, differences from FIG. 6A are mainly described.

The cache latches LCH may be disposed in the center of the second page buffer unit 220B d. The cache latches LCH may be disposed between the low voltage operation units LV. The cache latches LCH disposed in the center of the second page buffer unit 220Bd may be referred to as a 'center cache latch unit CCL'. That is, the second page buffer unit 220Bd may include a center cache latch unit CCL. The center cache latch unit CCL may be disposed on the second lower semiconductor layer D2 d. The center cache latch unit CCL may overlap with the second upper semiconductor layer U2 d in a vertical direction.

The page buffer decoder PBD may be disposed between the cache latches LCH. The page buffer decoder PBD may be disposed in the center of the second page buffer unit 220Bd. The page buffer decoder PBD may be disposed in the center of the center cache latch unit CCL. The page buffer decoder PBD may be disposed in the second lower semiconductor layer D2d. The page buffer decoder PBD may overlap the second upper semiconductor layer U2d in a vertical direction.

The page buffer decoder PBD may be disposed between the cache latches LCH. The page buffer decoder PBD may be disposed in the center of the second page buffer unit 220Bd. The page buffer decoder PBD may be disposed in the center of the center cache latch unit CCL. The page buffer decoder PBD may be disposed in the second lower semiconductor layer D2 d. The page buffer decoder PBD may overlap with the second upper semiconductor layer U2 d in a vertical direction.

Because the through-vias THV overlap with the through-via contacts THC in a vertical direction, the through vias THV may be disposed to be spaced apart from each other at different intervals (e.g., D or D'). The through-vias THV may pass through the second memory cell array 210Bd to be connected to the second page buffer unit 220Bd. For example, a first one of the through-vias THV may be connected to a first page buffer of the second page buffer unit 220Bd, a second one of the through-vias THV may be connected to a second page buffer of the second page buffer unit 220Bd, etc.

The semiconductor devices corresponding to the low voltage operation unit LV may be separately disposed in the first lower semiconductor layer D1d and the second lower semiconductor layer D2d. The low voltage operation unit LV may be disposed adjacent to the high voltage operation unit HV. For example, the low voltage operation unit LV may be disposed between the center cache latch unit CCL and the high voltage operation unit HV.

The low voltage operation unit LV disposed closest to the second page buffer driver 221Bd may be disposed in the first lower semiconductor layer D1d, and the other low voltage operation units LV may be disposed in the second lower semiconductor layer D2 d. Accordingly, the low voltage operation unit LV disposed closest to the second page buffer driver 221Bd may overlap with the first upper semiconductor layer U1d in a vertical direction.

According to an embodiment of the inventive concept, the first lower semiconductor layer D1d may include the low voltage operation unit LV disposed closest to the second page buffer driver 221Bd. The low voltage operation unit LV formed in the first lower semiconductor layer D1d may have a planar area as large as an expansion region Ad. Accordingly, the Internal peripheral circuit 240A of FIG. 4C formed adjacent to the second page buffer unit 220Bd of the second lower semiconductor layer D2d in the first direction X may additionally secure the expansion region A. Since the extension region A is secured to be larger, a size of the external peripheral circuit 240B in the first direction may be formed smaller, so that the degree of integration of the memory device 200 in FIG. 4C may be improved.

In the embodiment according to the inventive concept, only the second page buffer unit 220Bd is shown, but the first, third and fourth page buffer units 220A, 220C, and 220D may also include the center cache latch unit CCL. However, the inventive concept is not limited thereto. For example, the memory device 200 of FIG. 4C may be implemented in various cases in which the second and fourth page buffer units 220B and 220D in FIG. 4C have the same structure and the first and third page buffer units 220A and 220C of FIG. 4C have the same structure. For example, the memory device 200 in FIG. 4C may be implemented such that the first and third page buffer units 220A and 220C in FIG. 4C include the center cache latch unit CCL and the second and fourth page buffer units 220B and 220D of FIG. 4C include the edge cache latch unit ECL of FIG. 6A.

Figure 7A:
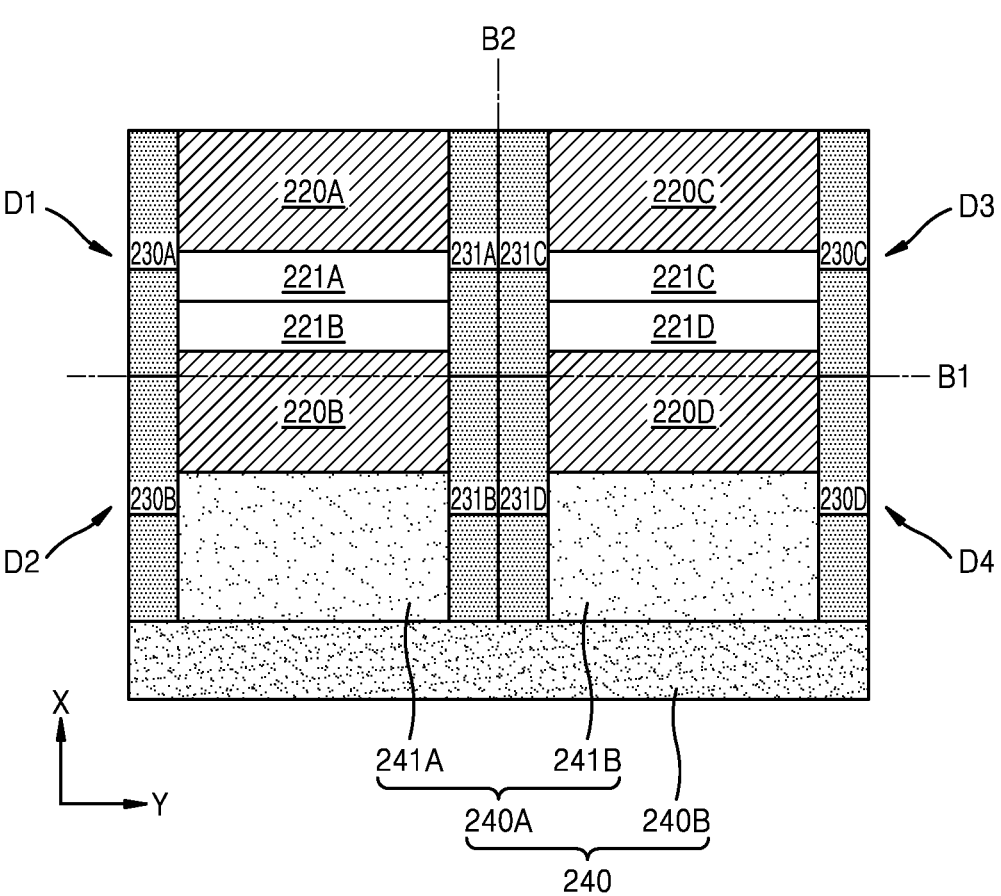
FIGS. 7A to 7C are schematic diagrams of a memory device illustrating arrangement of a row decoder according to an example embodiment of the inventive concept.
Figure 7B:
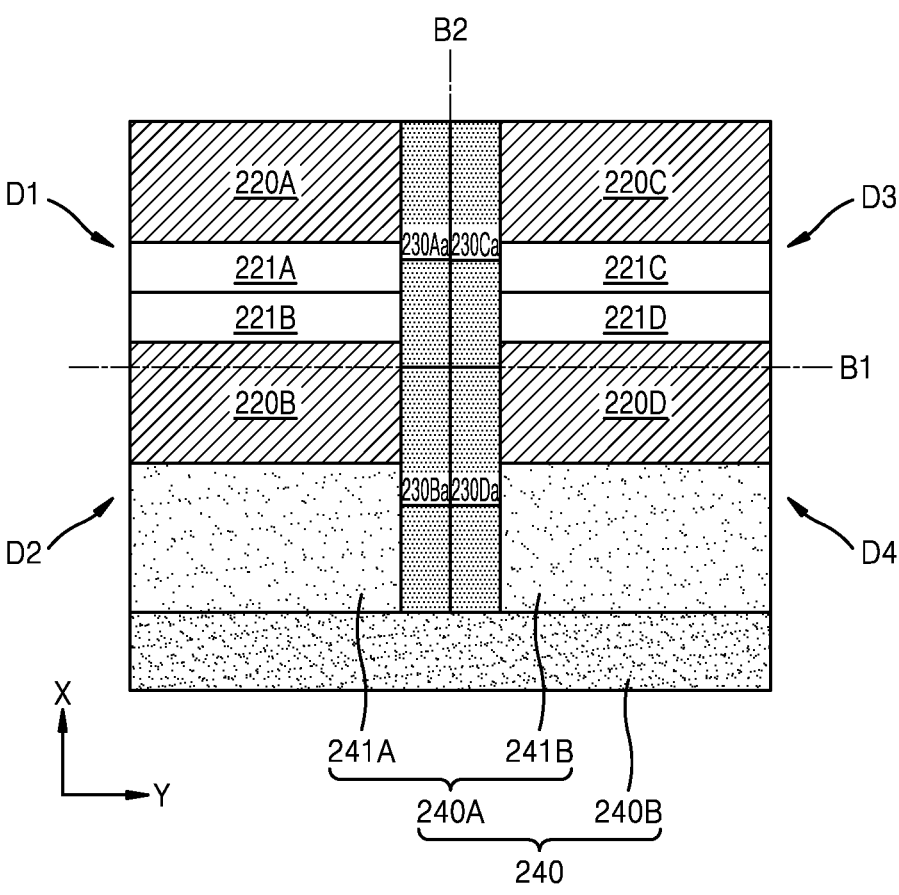
Figure 7C:
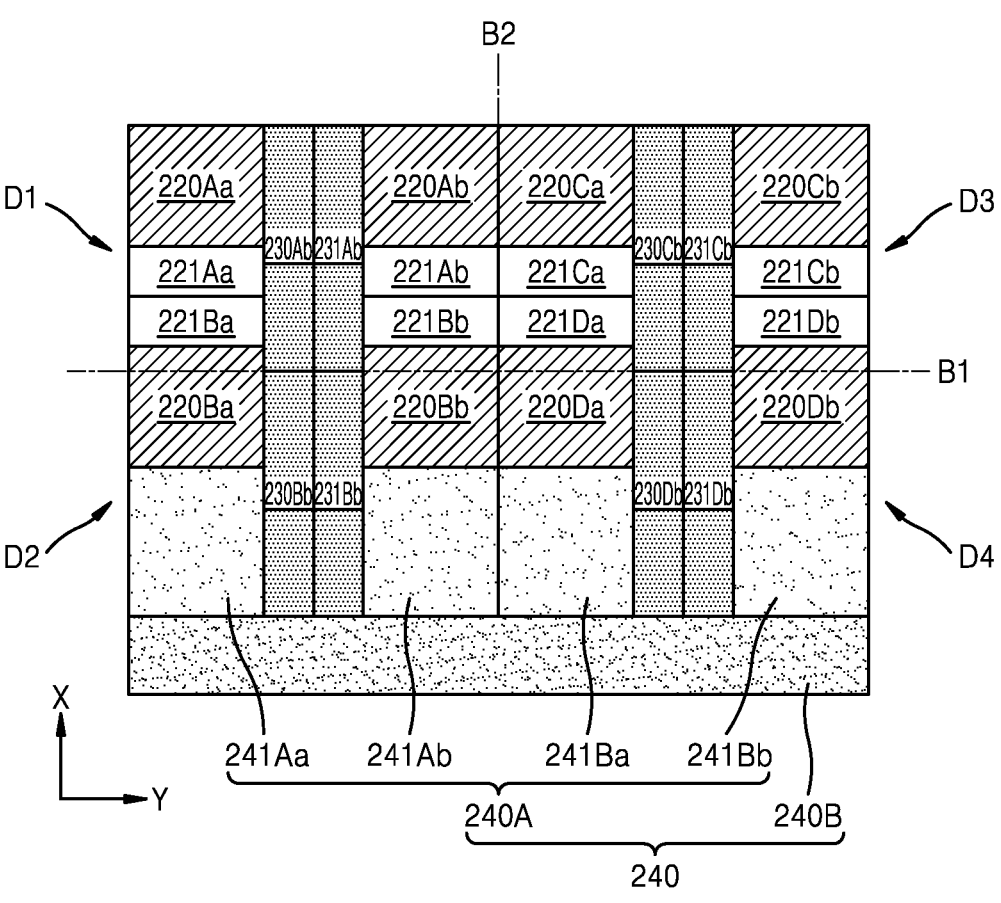

FIGS. 7A to 7C are schematic diagrams of a memory device illustrating an arrangement of a row decoder according to example embodiments of the inventive concept. In detail, FIGS. 7A to 7C are plan views illustrating upper surfaces of the first to fourth lower semiconductor layers D1 to D4 in contact with the first to fourth upper semiconductor layers U1 to U4 to illustrate various arrangements of the row decoder formed in each of the first to fourth lower semiconductor layers D1 to D4. Hereinafter, descriptions are given with reference to FIGS. 1 to 4C, and a subscript (e.g., a in 240Aa) attached to the end of a reference sign is used to distinguish between a plurality of circuits performing the same function. In addition, as described above with reference to FIG. 4C, in FIGS. 7A to 7C, the first boundary B1 may refer to the boundary between the first and second lower semiconductor layers D1 and D2 and the boundary between the third and fourth lower semiconductor layers D3 and D4, and the second boundary B2 may refer to the boundary between the first and third lower semiconductor layers D1 and D3 and the boundary between the second and fourth lower semiconductor layers D2 and D4.

Referring to FIG. 7A, compared with the first to fourth lower semiconductor layers D1 to D4 of FIG. 4C, the first to fourth lower semiconductor layers D1 to D4 includes the first to fourth row decoder 230A to 230D, respectively, and further include first to fourth additional row decoders 231A to 231D, respectively. Hereinafter, differences from FIG. 4C are mainly described.

In an embodiment, each of the first to fourth additional row decoders 231A to 231D may have a length in the first direction X substantially equal to a length of each of the first to fourth row decoders 230A to 230D in the first direction X.

The first additional row decoder 231A and the first row decoder 230A may be disposed to be spaced apart from each other with the first page buffer unit 220A therebetween. The first additional row decoder 231A may be disposed adjacent to the third lower semiconductor layer D3, and the first row decoder 230A may be disposed to be spaced apart from the third lower semiconductor layer D3 in the second direction Y.

The second additional row decoder 231B and the second row decoder 230B may be disposed to be spaced apart from each other with the second page buffer unit 220B therebetween. The second additional row decoder 231B may be disposed adjacent to the fourth lower semiconductor layer D4, and the second row decoder 230B may be disposed to be spaced apart from the fourth lower semiconductor layer D4 in the second direction Y.

The third additional row decoder 231C may be disposed adjacent to the first additional row decoder 231A in the second direction Y. The third additional row decoder 231C and the third row decoder 230C may be disposed to be spaced apart from each other with the third page buffer unit 220C therebetween. The third additional row decoder 231C may be disposed adjacent to the first lower semiconductor layer D1, and the third row decoder 230C may be disposed to be spaced apart from the first lower semiconductor layer D1 in the second direction Y.

The fourth additional row decoder 231D may be disposed adjacent to the second additional row decoder 231B in the second direction Y. The fourth additional row decoder 231D and the fourth row decoder 230D may be disposed to be spaced apart from each other with the fourth page buffer unit 220D therebetween. The fourth additional row decoder 231D may be disposed adjacent to the second lower semiconductor layer D2, and the fourth row decoder 230D may be disposed to be spaced apart from the second lower semiconductor layer D2 in the second direction Y.

Since the first to fourth lower semiconductor layers D1 to D4 further include the first to fourth additional row decoders 231A to 231D, the internal peripheral circuit 240A may be configured to include the first internal peripheral circuit 241A and the second internal peripheral circuit 241B that is separate from the first internal peripheral circuit 241A. The first internal peripheral circuit 241A may be formed in the second lower semiconductor layer D2, and the second internal peripheral circuit 241B may be formed in the fourth lower semiconductor layer D4.

Referring to FIG. 7B, compared with the first to fourth lower semiconductor layers D1 to D4 of FIG. 7A, the first to fourth additional row decoders 231A to 231D are not further included, and the first to fourth row decoders 230Aa to 230Da are configured like the arrangement of the first to fourth additional row decoders 231A to 231D of FIG. 7A. Hereinafter, differences from FIG. 4C are mainly described.

A first row decoder 230Aa may be disposed adjacent to a third row decoder 230Ca in the second direction Y. The first row decoder 230Aa may be formed in the first lower semiconductor layer D1 to be adjacent to the third lower semiconductor layer D3 in the second direction Y, and the third row decoder 230Ca may be formed in the third lower semiconductor layer D3 to be adjacent to the first lower semiconductor layer D1 in the second direction Y. That is, the first row decoder 230Aa and the third row decoder 230Ca may each be disposed at the second boundary B2.

The second row decoder 230Ba may be disposed adjacent to the fourth row decoder 230Da in the second direction Y. The second row decoder 230Ba may be formed in the second lower semiconductor layer D2 to be adjacent to the fourth lower semiconductor layer D4 in the second direction Y, and the fourth row decoder 230Da may be formed in the fourth lower semiconductor layer D4 to be adjacent to the second lower semiconductor layer D2 in the second direction Y. That is, the second row decoder 230Ba and the fourth row decoder 230Da may each be disposed at the second boundary B2.

Since the first and third row decoders 230Aa and 230Ca are disposed adjacent to each other and the second and fourth row decoders 230Ba and 230Da are disposed adjacent to each other, the internal peripheral circuit 240A may be divided into separate circuits to be disposed as the first internal peripheral circuit 241A and the second internal peripheral circuit 241B. The first internal peripheral circuit 241A may be formed in the second lower semiconductor layer D2, and the second internal peripheral circuit 241B may be formed in the fourth lower semiconductor layer D4.

Referring to FIG. 7C, compared with the first to fourth lower semiconductor layers D1 to D4 of FIG. 7A, first to fourth row decoders 230Ab to 230Db and first to fourth additional row decoders 231Ab to 231Db are disposed in the center of the first to fourth lower semiconductor layers D1 to D4. Hereinafter, differences from FIG. 7A are mainly described.

The first row decoder 230Ab and the first additional row decoder 231Ab may be disposed adjacent to each other in the second direction Y. The first row decoder 230Ab and the first additional row decoder 231Ab may be disposed in the center on the axis of the first lower semiconductor layer D1 in the second direction Y. The second row decoder 230Bb and the second additional row decoder 231Bb may be disposed adjacent to each other in the second direction Y. The second row decoder 230Bb and the second additional row decoder 231Bb may be disposed in the center on the axis of the second lower semiconductor layer D2 in the second direction Y.

Accordingly, the first page buffer unit 220A of FIG. 4C may be divided into a first sub page buffer unit 220Aa and a second sub page buffer unit 220Ab. For example, the first sub page buffer unit 220Aa may include some page buffers of the first page buffer unit 220A and the second sub page buffer unit 220Ab may include the remaining page buffers of the first page buffer unit 220A. The second page buffer unit 220B in FIG. 4C may be divided into and disposed as a third sub page buffer unit 220Ba and a fourth sub page buffer unit 220Bb. For example, the third sub page buffer unit 220Ba may include some page buffers of the second page buffer unit 220B and the fourth sub page buffer unit 220Bb may include the remaining page buffers of the second page buffer unit 220B. The first page buffer driver 221A of FIG. 4C may be divided into and disposed as a first sub page buffer driver 221Aa and a second sub page buffer driver 221Ab. The second page buffer driver 221B of FIG. 4C may be divided into and disposed as a third sub page buffer driver 221Ba and a fourth sub page buffer driver 221Bb.

A third row decoder 230Cb and a third additional row decoder 231Cb may be disposed adjacent to each other in the second direction Y. The third row decoder 230Cb and the third additional row decoder 231Cb may be disposed in the center on the axis of the third lower semiconductor layer D3 in the second direction Y. A fourth row decoder 230Db and a fourth additional row decoder 231Db may be disposed adjacent to each other in the second direction Y. A fourth row decoder 230Db and a fourth additional row decoder 231Db may be disposed in the center on the axis of the fourth lower semiconductor layer D4 in the second direction Y.

Accordingly, the third page buffer unit 220C in FIG. 4C may be divided into and disposed as a fifth sub page buffer unit 220Ca and a sixth sub page buffer unit 220Cb. For example, the fifth sub page buffer unit 220Ca may include some page buffers of the third page buffer unit 220C and the sixth sub page buffer unit 220Cb may include the remaining page buffers of the third page buffer unit 220C. The fourth page buffer unit 220D of FIG. 4C may be divided into and disposed as a seventh sub page buffer unit 220Da and an eighth sub page buffer unit 220Db. For example, the seventh sub page buffer unit 220Da may include some page buffers of the fourth page buffer unit 220D and the eighth sub page buffer unit 220Db may include the remaining page buffers of the fourth page buffer unit 220D. The third page buffer driver 221C of FIG. 4C may be divided into and disposed as a fifth sub page buffer driver 221Ca and a sixth sub page buffer driver 221Cb. The fourth page buffer driver 221D of FIG. 4C may be divided into and disposed as a seventh sub page buffer driver 221Da and an eighth sub page buffer driver 221Db.

Since the first to fourth row decoders 230Ab to 230Db and the first to fourth additional row decoders 231Ab to 231Db are disposed in the center of the first to fourth lower semiconductor layers D1 to D4, respectively, the inner peripheral circuit 240A may be divided into and disposed as first internal peripheral circuit 241Aa, a second internal peripheral circuit 241Ab, a third internal peripheral circuit 241Ba, and a fourth internal peripheral circuit 241Bb. The first internal peripheral circuit 241Aa and the second internal peripheral circuit 241Ab are formed in the second lower semiconductor layer D2, and the third internal peripheral circuit 241Ba and the fourth internal peripheral circuit 241Bb may be formed in the fourth lower semiconductor layer D4.

Figure 8:
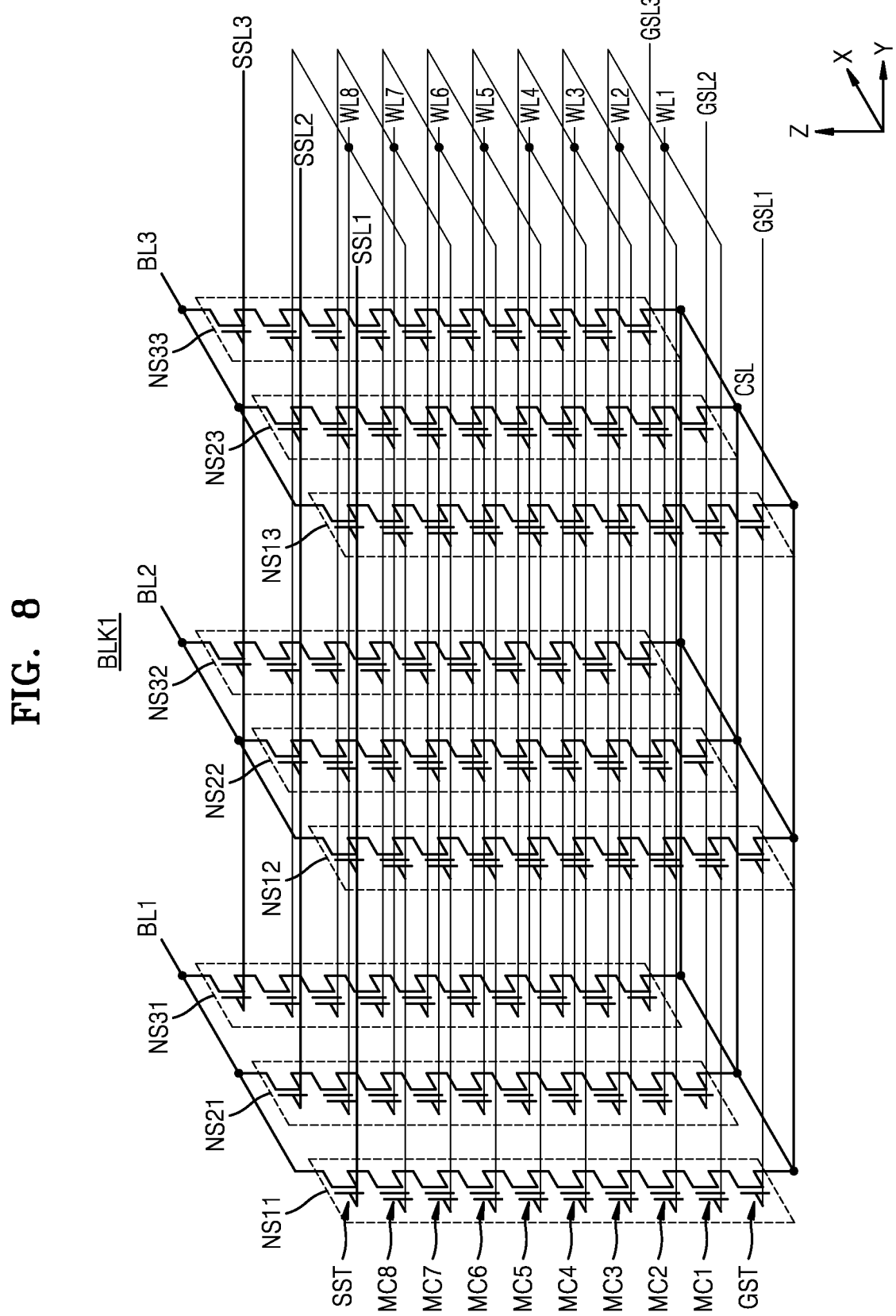
FIG. 8 is an equivalent circuit diagram of a memory block included in a memory device according to an example embodiment of the inventive concept.

FIG. 8 is an equivalent circuit diagram of a memory block included in a memory device according to an example embodiment of the inventive concept. The memory block illustrated in FIG. 8 is the first memory block BLK1 as an example of the memory blocks BLK1 to BLKz described above with reference to FIG. 1. Hereinafter, embodiments of the inventive concept are described based on the first memory block BLK1 as an example. The first memory block BLK1 represents a 3D memory block formed in a 3D structure on a substrate. A plurality of memory cell strings included in the first memory block BLK1 may be formed in the third direction Z perpendicular to the substrate.

Referring to FIG. 8, the first memory block BLK1 may include cell strings (or NAND strings) NS11 to NS33, word lines WL1 to WL8, bit lines BL1 to BL3, and ground select lines GSL1 to GSL3, string select lines SSL1 to SSL3, and a common source line CSL. Although it is illustrated in FIG. 8 that each of the cell strings NS11 to NS33 includes eight memory cells MCs connected to eight word lines WL1 to WL8, the inventive concept is not limited thereto.

Each cell string (e.g., NS11) may include a string select transistor SST connected in series, a plurality of memory cells MC1 to MC8 (MC), and a ground select transistor GST connected in series. The string select transistor SST is connected to the corresponding string select line SSL1. The memory cells MC are respectively connected to the word lines WL1 to WL8. The ground select transistor GST is connected to the corresponding ground select line GSL1. The string select transistor SST is connected to the corresponding bit lines BL1 to BL3, and the ground select transistor GST is connected to the common source line CSL.

According to an embodiment, in each cell string, one or more dummy memory cells may be provided between the string select transistor SST and the memory cells MC. In each cell string, one or more dummy memory cells may be provided between the ground select transistor GST and the memory cells MC. In each cell string, one or more dummy memory cells may be provided between the memory cells MC. The dummy memory cells may have the same structure as the memory cells MC, and may be unprogrammed (e.g., program inhibited) or programmed to be different from the memory cells MC. For example, when the memory cells MC are programmed to have two or more threshold voltage distributions, the dummy memory cells may be programmed to have one threshold voltage distribution range or a smaller number of threshold voltage distributions than that of the memory cells MC.

Figure 9:
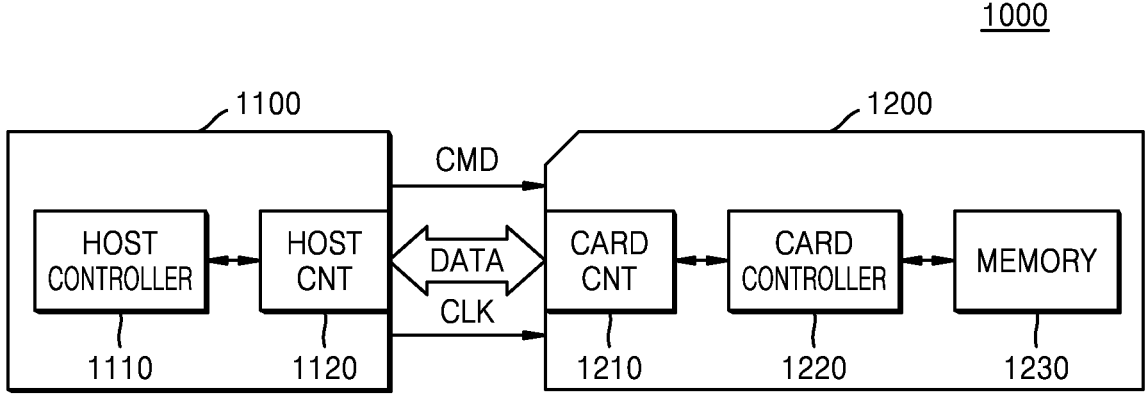
FIG. 9 is a block diagram illustrating a memory card system including a memory device according to an example embodiment of the inventive concept.

FIG. 9 is a block diagram illustrating a memory card system 1000 including a memory device according to an example embodiment of the inventive concept.

Referring to FIG. 9, the memory card system 1000 may include a host 1100 (e.g., a host device) and a memory card 1200.

The host 1100 may include a host controller 1110 (e.g., a controller circuit) and a host connection unit 1120 (e.g., an interface circuit). The host 1100 may store data in the memory card 1200 or read data stored in the memory card 1200. The host controller 1110 may transmit a request for instructing a desired operation of the memory card 1200, a clock signal, and data to the memory card 1200 through the host connection unit 1120.

The memory card 1200 may include a card connection unit 1210 (e.g., an interface circuit), a card controller 1220, and a memory device 1230. The memory card 1200 may include a compact flash card (CFC), a microdrive, a smart media card (SMC), a multimedia card (MMC), a security digital card (SDC), a memory stick, and a universal serial bus (USB), a flash memory driver, etc.

The card controller 1220 may store data received from the host 1100 in the memory device 1230 or transfer data stored in the memory device 1230 to the host 1100 through the card connection unit 1210, in response to a request received through the card connection unit 1210

The memory device 1230 may be implemented according to the embodiments described above with reference to FIGS. 1 to 8. Accordingly, the memory device 1230 may have a high degree of integration, and the memory card 1200 may have a high data storage capacity.

Figure 10:
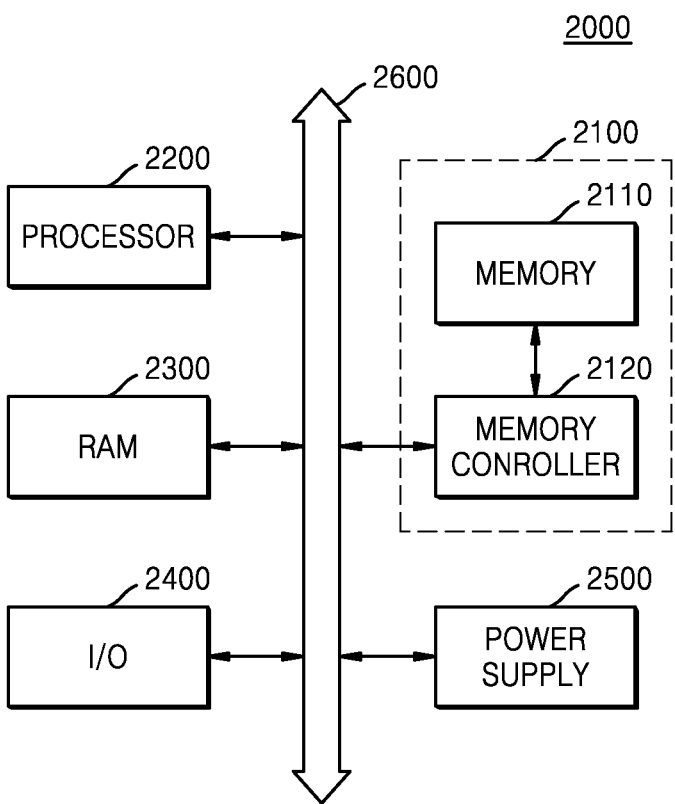
FIG. 10 is a block diagram illustrating a computing system including a memory device according to an example embodiment of the inventive concept.

FIG. 10 is a block diagram illustrating a computing system 2000 including a memory device according to an example embodiment of the inventive concept.

Referring to FIG. 10, the computing system 2000 may include a memory system 2100, a processor 2200, a random-access memory (RAM) 2300, an input/output (I/O) device 2400, and a power supply 2500. Although not shown in FIG. 10, the computing system 2000 may further include a port capable of communicating with a video card, a sound card, a memory card, a universal-serial-bus (USB) device, or the like, for communicating with other electronic systems. The computing system 2000 may be implemented as a desktop computer, a server, or the like, or may be implemented as a portable electronic device such as a laptop computer, a mobile phone, a personal digital assistant (PDA), and a camera.

The memory system 2100 may include a memory device 2110 and a memory controller 2120 (e.g., a controller circuit). The memory device 2110 may be implemented according to the embodiments described above with reference to FIGS. 1 to 8. Accordingly, the memory device 2110 may have a high degree of integration, and the memory system 2100 may have a high storage capacity. The memory controller 2120 may control the operation of the memory device 2110. For example, the memory device 2110 may receive a command and an address from the memory controller 2120, and may receive data for a write operation or a read operation from the memory controller 2120 or transmit data to the memory controller 2120.

The processor 2200 may perform certain calculations or tasks. For example, the processor 2200 may include a micro-processor, a central processing unit (CPU), an application processor (AP), or the like. The processor 2200 may communicate with the RAM 2300, the I/O device 2400, and the memory system 2100 through a bus 2600. The processor 2200 may also be connected to an expansion bus, such as a peripheral component interconnect (PCI) bus.

The RAM 2300 may store data required during an operation of the computing system 2000. For example, the RAM 2300 may include DRAM, mobile DRAM, SRAM, PRAM, FRAM, RRAM, and/or MRAM.

The I/O device 2400 may include an input device such as a keyboard, a keypad or a mouse, and an output device such as a printer and a display.

The power supply 2500 may supply an operating voltage required for the operation of the computing system 2000.

Figure 11:
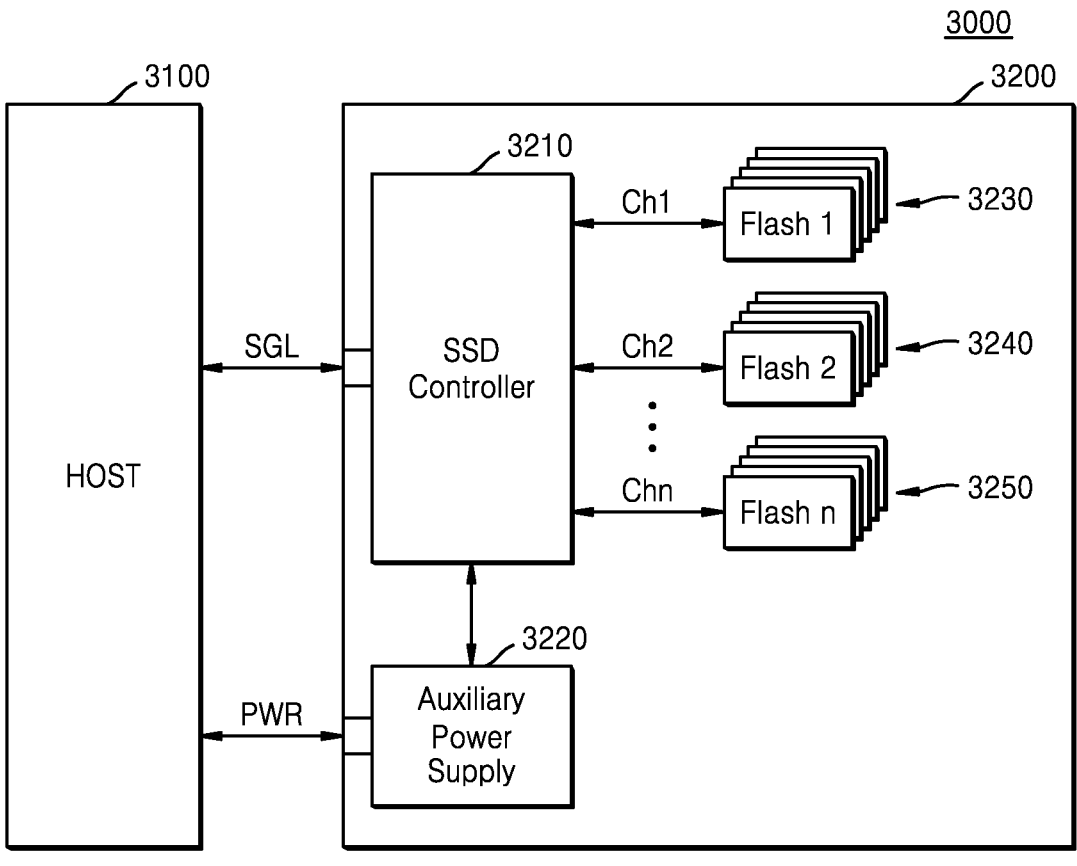
FIG. 11 is a block diagram illustrating a solid state drive (SSD) system including a memory device according to an example embodiment of the inventive concept.

FIG. 11 is a block diagram illustrating a solid state drive (SSD) system 3000 including a memory device according to an example embodiment of the inventive concept.

Referring to FIG. 11, the SSD system 3000 may include a host 3100 and an SSD 3200.

The SSD 3200 may transmit and receive signals to and from the host 3100 through a signal connector, and may receive power through a power connector. The SSD 3200 may include an SSD controller 3210, an auxiliary power supply 3220, and a plurality of memory devices 3230, 3240, and 3250. Each of the memory devices 3230, 3240, and 3250 may be a vertically stacked NAND flash memory device. Each of the memory devices 3230, 3240, and 3250 may be implemented according to the embodiments described above with reference to FIGS. 1 to 8. Accordingly, each of the memory devices 3230, 3240, and 3250 may have a high degree of integration, and the SSD 3200 may provide a high data storage capacity to the host 3100.

While the inventive concept has been particularly shown and described with reference to embodiments thereof, it will be understood that various changes in form and details may be made therein without departing from the spirit and scope of the following claims.

What is claimed is:

1. A memory device comprising:
a first lower semiconductor layer disposed below a first upper semiconductor layer including a first memory cell array, the first lower semiconductor layer including a first page buffer unit electrically connected to the first memory cell array; and
a second lower semiconductor layer disposed below a second upper semiconductor layer including a second memory cell array and disposed adjacent to the first upper semiconductor layer in a first direction, the second lower semiconductor layer including a first portion of a second page buffer unit electrically connected to the second memory cell array and disposed adjacent to the first lower semiconductor layer in the first direction,
wherein the first lower semiconductor layer further includes a second portion of the second page buffer unit different from the first portion.

2. The memory device of claim 1, wherein the first lower semiconductor layer further comprises:
a first page buffer driver disposed between the first page buffer unit and the second portion of the second page buffer unit and configured to control a cache latch of the first page buffer unit; and
a second page buffer driver disposed between the first page buffer driver and the second portion of the second page buffer unit and configured to control a cache latch of the second page buffer unit.

3. The memory device of claim 2, wherein the second page buffer unit includes an edge cache latch overlapping with the first upper semiconductor layer in a vertical direction, and the edge cache latch includes a plurality of cache latches disposed at an edge of the second page buffer unit to be adjacent to the second page buffer driver.

4. The memory device of claim 3,
wherein the second upper semiconductor layer further includes an edge through-via portion disposed at an edge of the second upper semiconductor layer to be adjacent to the first upper semiconductor layer and including a plurality of through-vias passing through the second memory cell array to be connected to the second page buffer unit, and
wherein the second page buffer unit further includes an edge contact portion including a plurality of through-via contacts disposed to overlap with the plurality of through-vias in a vertical direction to be connected to the plurality of through-vias.

5. The memory device of claim 4, wherein the second page buffer unit further includes a low voltage circuit including at least one transistor configured to operate based on a low voltage, disposed between the edge cache latch and the edge contact portion, and overlapping with the first upper semiconductor layer in a vertical direction.

6. The memory device of claim 5, wherein the second page buffer unit further includes a high voltage circuit including at least one transistor configured to operate based on a high voltage, disposed between the low voltage circuit and the edge contact portion, and overlapping with the first upper semiconductor layer in a vertical direction.

7. The memory device of claim 3, wherein the second page buffer unit includes a plurality of cache latches disposed in a center of the second page buffer unit in the first direction.

8. The memory device of claim 1, wherein the second page buffer unit comprises:
a plurality of cache latches disposed in a center of the second page buffer unit in the first direction and overlapping with the second upper semiconductor layer in a vertical direction; and
at least one transistor configured to operate based on a low voltage and overlapping with the first upper semiconductor layer in a vertical direction.

9. The memory device of claim 1, wherein the second lower semiconductor layer further includes an internal peripheral circuit disposed adjacent to the first portion of the second page buffer unit in the first direction and including circuits configured to control the first memory cell array and the second memory cell array.

10. The memory device of claim 9, wherein the internal peripheral circuit includes at least one of a voltage generator, an error correction circuit, a scheduler, a command decoder, and an address decoder.

11. A non-volatile memory device comprising:
a first lower semiconductor layer disposed below a first upper semiconductor layer including a first memory cell array, the first lower semiconductor layer overlapping with the first upper semiconductor layer in a vertical direction; and
a second lower semiconductor layer disposed below a second upper semiconductor layer including a second memory cell array and disposed adjacent to the first upper semiconductor layer in a first direction, the second lower semiconductor layer overlapping with the second upper semiconductor layer in a vertical direction,
wherein the first lower semiconductor layer comprises:
a first page buffer unit disposed in a second direction perpendicular to the first direction and electrically connected to the first memory cell array;
a plurality of cache latches disposed in the second direction and spaced apart from the first page buffer unit in the first direction, and disposed at an edge of a portion of a second page buffer unit electrically connected to the second memory cell array to overlap with the first upper semiconductor layer in a vertical direction; and
a first row decoder disposed adjacent to the first page buffer unit and the plurality of cache latches in the second direction and electrically connected to the first memory cell array.

* * * * *